United States Patent [19]

Kodama et al.

[11] Patent Number: 5,269,643

[45] Date of Patent: Dec. 14, 1993

[54] METHOD AND APPARATUS FOR TRANSFERRING WAFERS FROM WAFER CARRIER TO WAFER CONVEYOR APPARATUS IN CARRIERLESS WAFER SURFACE TREATMENT APPARATUS

[75] Inventors: Shunsaku Kodama; Yasumasa Shima; Shigeru Kohara; Yasuhiko Ohashi, all of Shiga, Japan

[73] Assignee: Danippon Screen Manufacturing Co., Ltd., Japan

[21] Appl. No.: 856,099

[22] Filed: Mar. 23, 1992

[30] Foreign Application Priority Data

Mar. 22, 1991 [JP] Japan .................. 3-83558

[51] Int. Cl.⁵ .............................. B65G 49/07
[52] U.S. Cl. .................. 414/416; 414/222; 414/331; 414/786; 414/938
[58] Field of Search ............. 414/222, 331, 404, 416, 414/757, 786, DIG. 4, DIG. 6

[56] References Cited

U.S. PATENT DOCUMENTS

| 4,566,839 | 1/1986 | Butler | 414/404 |
|---|---|---|---|
| 4,568,234 | 2/1986 | Lee et al. | 414/416 X |
| 4,611,966 | 9/1986 | Johnson | 414/417 X |
| 4,662,811 | 5/1987 | Hayden | 414/757 X |
| 4,701,096 | 10/1987 | Fisher, Jr. | 414/331 X |
| 4,806,057 | 2/1989 | Cay et al. | 414/416 X |
| 4,840,530 | 6/1989 | Nguyen | 414/416 X |
| 4,938,655 | 7/1990 | Asano | 414/416 X |
| 4,955,775 | 9/1990 | Ohkase et al. | 414/222 X |
| 5,110,248 | 5/1992 | Asano et al. | 414/416 X |
| 5,131,799 | 7/1992 | Nishi et al. | 414/416 |

FOREIGN PATENT DOCUMENTS

| 2567160 | 1/1986 | France | 414/627 |
|---|---|---|---|
| 0124407 | 6/1986 | Japan | 414/405 |
| 62-78752 | 5/1987 | Japan . | |
| 0149152 | 7/1987 | Japan | 414/416 |
| 0129437 | 5/1989 | Japan | 414/416 |
| 0234823 | 9/1990 | Japan . | |
| 0240033 | 10/1990 | Japan . | |
| 3116731 | 5/1991 | Japan . | |

OTHER PUBLICATIONS

Semiconductor World, Mar. 1991, pp. 149-152 and p. 162.

Primary Examiner—Michael S. Huppert
Assistant Examiner—James Keenan
Attorney, Agent, or Firm—Ostrolenk, Faber, Gerb & Soffen

[57] ABSTRACT

A method of taking out and transferring a plurality of wafers from each of a plurality of wafer carriers to a wafer conveyor robot includes the steps of taking out wafer groups inside the wafer carriers from respective wafer carriers and aligning the same on a straight line with respective wafer groups being spaced apart, shifting at least one of the wafer groups so that an interval between the spaced wafer groups becomes equal to intervals among the wafers in each of wafer groups, and holding the shifted wafer groups with the wafer conveyor robot. An apparatus for practicing this method is also disclosed.

55 Claims, 16 Drawing Sheets

METHOD AND APPARATUS FOR TRANSFERRING WAFERS FROM WAFER CARRIER TO WAFER CONVEYOR APPARATUS IN CARRIERLESS WAFER SURFACE TREATMENT APPARATUS

BACKGROUND OF THE INVENTION

1. Field of the Invention

The present invention relates to methods and apparatus for transferring wafers from wafer carriers to wafer conveyor apparatus in surface treatment apparatus of so-called carrierless systems for removing laminate-like wafers such as semiconductor substrates (hereinafter referred to as wafers) from wafer carriers and treating surfaces thereof. For example, the present invention relates to a method and apparatus for wet treatment in which a number of wafers are dipped into a treatment bath containing a surface treatment solution as an etching solution, a film removing solution, a developing solution or a cleaning solution, or an apparatus for vapor treatment in which vapor of such a treatment solution is supplied to a number of wafers inside a treatment bath for treating the same with the vapor.

2. Description of the Related Art

With development in semiconductor technology having reached a high level, techniques for maintaining high wafer quality are required in the wafer manufacturing process. Presently used in the surface treatment of wafers is a carrier batch system and a carrierless system. In the carrier batch system, wafers are transferred from a conveyor carrier to a surface treatment carrier and then the wafer surfaces are treated. In the carrierless system, wafers are treated without being stored in a carrier during surface treatment. Both of these systems are intended to prevent dust from contaminating the surface treatment bath.

The carrierless system has a larger number of advantages as compared to the carrier batch system. For example, in the carrierless system, dust attaching to a carrier is never brought into a surface treatment bath. Accordingly, contamination of the surface treatment solution is reduced. The amount of the treatment solution which is brought out of the treatment bath decreases to reduce the amount of the solution that is consumed. Some of the treatment solution which is brought out of the treatment bath and is returned to the bath to prevent degradation of the treatment solution. Furthermore, in the carrierless system, dead space inside a wafer dipping tank is smaller because it does not use a carrier. Accordingly, the surface treatment apparatus can be reduced in size. The unit cost of space of a clean room in which a surface treatment apparatus is provided is high, so that the cost of the entire system can be reduced if the apparatus can be smaller. Furthermore, since a smaller capacity tank can be used, the treatment solution can be saved to facilitate management of the solution.

Such known carrierless systems include one disclosed in Japanese Utility Model Laying-Open No. 2-47046. Referring to FIGS. 1 and 2 herein, wafer chuck 115 of a wafer conveyor apparatus (a wafer conveyor robot) used in the system disclosed in Japanese Utility Model Laying-Open No. 2-47046 includes a pair of parallel arms 118, and chuck hands 19 provided facing each other on lower portions of inner surfaces of arms 118 for holding a wafer W. A number of grooves 119a are formed in respective chuck hands 119 for accommodating wafers W and supporting wafers W from underneath.

In order to treat a number of wafers in a single surface treatment, a sufficient number of grooves 119a (FIG. 2) for holding wafers stored in two wafer carriers are formed in chuck hands 119. Grooves 119a are formed separately in two regions in each chuck hand 119 corresponding to each of wafer carriers as shown in FIG. 2.

Operation of the system disclosed in Japanese Utility Model Laying-Open No. 2-47046 includes a step of positioning two wafer carriers each accommodating a plurality of wafers such that the surfaces thereof are vertical and peripheries of respective wafers are aligned so that wafer alignment directions thereof coincide with each other, a step of engaging wafers inside respective wafer carriers with two wafer holding members to hold them together respectively, a step of holding together the wafers held by two wafer holding members with wafer chuck 115 shown in FIGS. 1 and 2, and a step of conveying the wafers held by wafer chuck 115 into a surface treatment apparatus.

In this case, an interval or space between the wafer carriers is larger than an interval between wafers stored in respective wafer carriers. Accordingly, grooves 119a of chuck hands 119 had to be formed in two regions corresponding to respective wafer carriers as shown in FIG. 2.

In the system disclosed in Japanese Utility Model Laying-Open No. 2-47046, wafers for two carriers can be collectively subjected to surface treatment being held by wafer chuck 115. Therefore, the efficiency of surface treatment increases as compared to surface treatment in which wafers for a single carrier are treated individually. In this case, however, as clearly seen from FIG. 2, the interval between wafer groups of each wafer carrier is larger than the intervals between respective wafers in a group. The efficiency of circulating a treatment solution inside a surface treatment bath varies in a portion of a large interval as compared with a portion of a narrow interval. Therefore, the surface treatment of wafers at both ends of each wafer group is not the same as the surface treatment of wafers provided in other portions. Such uneven surface treatment has to be avoided.

Such a method of transferring wafers as described above is also used for another prior art method that includes a step of positioning two wafer carriers accommodating a plurality of wafers in a standing and aligned manner so that the directions of aligning wafers are the same, a step of collectively holding the wafers inside each wafer carrier with such a wafer chuck 115 as shown in FIG. 2, and a step of transferring the wafers W held by wafer chuck 115 to a wafer holding member 121 (FIG. 3) previously positioned inside a surface treatment bath 120. In this method the wafers W are held inside a treatment solution S in a standing and aligned manner by wafer holding member 121.

Such a system also has a similar problem as that of the system disclosed in Japanese Utility Model Laying-Open No. 2-47046. Referring to FIG. 3, a relatively large space $S_1$ is formed between a wafer group $W_1$ from a first wafer carrier and a wafer group $W_2$ from a second wafer carrier. Also, relatively large space $S_2$ are formed between the wafer group $W_1$ and a wall surface of a treatment bath 120 and between the wafer group $W_2$ and a wall surface of treatment bath 120. On the other hand, relatively small spaces S are formed among wafers w included in each of wafer groups $W_1$ and $W_2$. The flow of the surface treatment solution changes according to the intervals among wafers. Accordingly, the surface treatment of wafers W will not be homogeneous corresponding to positions where wafers are located, that is, end portions of wafer groups or other portions.

Also, the prior art has a problem that a volume of surface treatment bath 120 is large. This is because the space $S_1$ between wafer groups $W_1$ and $W_2$ is unnecessarily large. Accordingly, an area required for provision of a surface treatment apparatus including a surface treatment bath and the like is large, and a greater quantity of surface treatment solution is required. Such problems as described above are encountered not only in the equipment for wet treatment but also in the equipment for vapor treatment.

SUMMARY OF THE INVENTION

Accordingly, one object of the present invention is to provide a method and apparatus of transferring wafers capable of passing wafers of a plurality of wafer carriers so that collective and uniform surface treatment can be applied thereto.

Another object of the present invention is to provide a method and apparatus for transferring wafers capable of collectively passing wafers of a plurality of wafer carriers to a surface treatment apparatus with distances among respective wafers being uniform.

It is yet another object of the present invention to provide a method and apparatus for transferring wafers capable of passing wafers to a surface treatment apparatus so that the wafers of a plurality of wafer carriers are collectively subjected to surface treatment and a quantity of treatment solution necessary in the surface treatment can be reduced.

It is an additional object of the present invention to provide a method and apparatus of transferring wafers capable of passing wafers to a surface treatment apparatus so that wafers of a plurality of wafer carriers can be collectively subjected to surface treatment and required capacity of a surface treatment bath can be reduced.

It is a further additional object of the present invention to provide a method and apparatus of transferring wafers capable of passing the wafers of a plurality of wafer carriers to a surface treatment apparatus with a distance between wafer groups of respective wafer carriers being equal to distances among respective wafers.

A method according to the present invention includes a method for holding and transferring, from a plurality of transmittable wafer carriers for storing wafer groups each including a predetermined plurality of wafers so that respective wafers are substantially parallel to each other at predetermined first intervals along an axis in a predetermined first direction, all the wafers at least stored in a wafer carrier to a wafer conveyor robot for conveying the wafers to a following wafer surface treatment process, including the steps of aligning wafer groups stored in respective wafer carriers on a predetermined straight line outside respective wafer carriers maintaining relative positional relation between wafers in respective wafer groups so that axes of respective wafer carriers coincide with each other and an interval in a first direction between wafer groups becomes a second interval larger than a first interval; shifting at least one of the wafer groups in the first direction so that the interval between aligned wafer groups is the first interval in the first direction; and holding the shifted wafer groups with the wafer conveyor robot.

According to this method, the wafers stored in a plurality of wafer carriers are aligned on a predetermined straight line outside the wafer carriers. At this time, a distance between respective wafer groups is the second interval larger than the first interval among wafers. By shifting at least one of the wafer groups along the first direction, the interval between wafer groups becomes the first interval in the first direction. Accordingly, all the wafers stored in the wafer carriers are aligned at first intervals with respect to each other. When holding the aligned wafers in a wafer conveyor robot, the distance between wafer groups will never be larger than the distance between wafers. The distance between a wafer at one end and a wafer at the other end in the wafers held by the wafer conveyor robot is reduced as compared to prior art. Accordingly, a chuck hand of a wafer conveyor robot can be reduced in length. Since the length of a surface treatment bath of a surface treatment apparatus can be reduced, the area and volume of the surface treatment bath can be reduced. Therefore, a smaller area is required for providing a surface treatment bath and also a smaller amount of treatment solution is required in surface treatment.

According to another aspect of the present invention, an apparatus for transferring wafer groups each including a predetermined plurality of wafers from a plurality of transmittable wafer carriers to a wafer conveyor robot includes an apparatus for aligning the wafer groups stored in respective wafer carriers on a predetermined straight line outside the respective wafer carriers maintaining relative relation between respective wafer groups so that axes of respective wafer groups coincide with each other and an interval in a first direction between respective wafer groups is a second interval larger than the first interval, and a shifting mechanism for shifting at least one of the wafer groups along the first direction so that the interval between the aligned wafer groups becomes the first interval in the first direction.

The wafer groups stored in wafer carriers are aligned on a predetermined straight line outside the wafer carriers. At this time, the relative relationship among wafers in each wafer group is maintained and axes of respective wafer groups coincide with each other. Also, the interval in the first direction between wafer groups is the second interval larger than the interval between wafers. Furthermore, by shifting at least one of the wafer groups along the first direction with the shifting mechanism, the distance between wafer groups becomes the first interval the same as the distance between wafers. By holding the shifted wafer groups with the wafer conveyor robot, all the wafers stored in the plurality of wafer carriers can be supplied to the surface treatment apparatus with intervals among respective wafers being uniform.

Since intervals among respective wafers are uniform, a flow of treatment solution flowing in a space among respective wafers inside a surface treatment bath is uniform and the wafer surface treatment is also uniform. Because the distance between wafer groups is small, the distance between wafers at both ends of a wafer train is also small. Accordingly, length and area of a surface treatment bath can be reduced to decrease an installation area of the surface treatment apparatus. Also, the volume of a surface treatment bath can be reduced, so than an amount of surface treatment solution required in a surface treatment bath can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
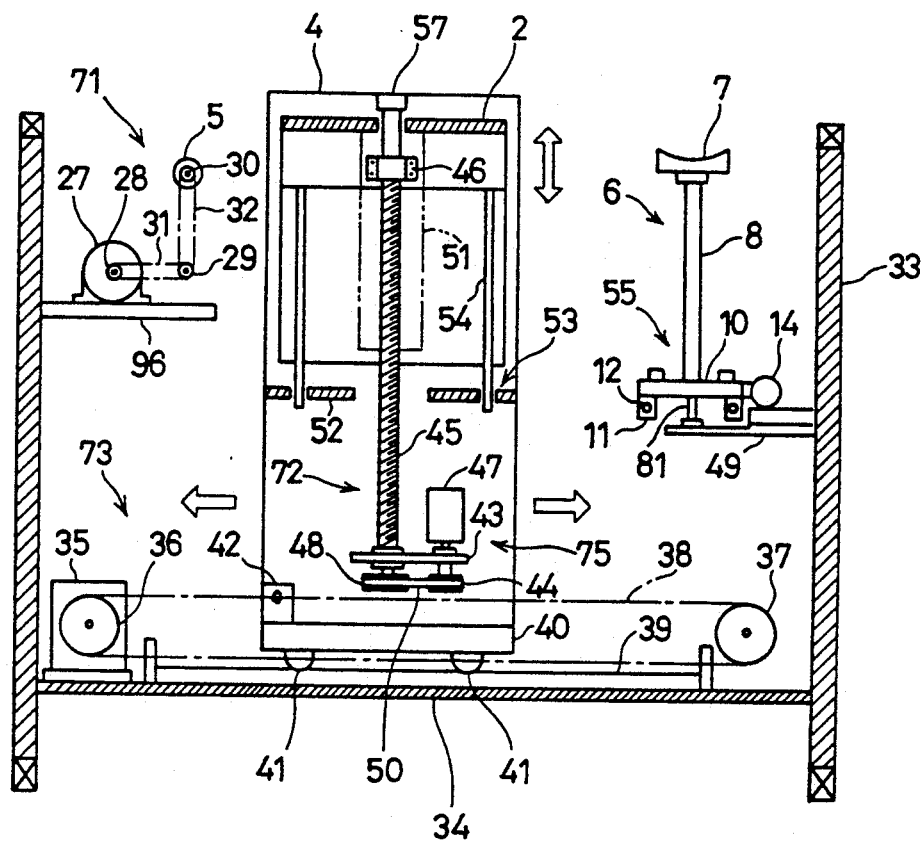
FIG. 5 is a cross-sectional view of an apparatus according to the first embodiment of the present invention.

Referring to FIG. 5, an apparatus according to the first embodiment of the present invention includes a frame 33 having a bottom plate 34, a wafer rotating mechanism 71 fixed on one inner surface of a side plate of frame 33 for aligning crystallographic reference directions of wafers stored in a wafer carrier by rotating the wafers, a moving frame 4 which is slidable to left and right and also slidable up and down with a wafer carrier being provided on its upper surface, and having a carrier table 2 having an opening, a wafer holder 6 provided on the other inner surface of the side plate of frame 33 for holding wafers conveyed by carrier table 2 in its grooves on the upper surface of a main body and for sliding wafers so that a distance between wafer groups stored in each carrier is equal to a distance between respective wafers, and a table sliding mechanism 73 provided on bottom plate 34 of frame 33 for moving moving frame 4 left and right so that carrier table 2 can be positioned alternately above wafer rotating mechanism 71 and above wafer holder 6.

A guide rod 54 is provided below carrier table 2. Provided in moving frame 4 are a table lifting mechanism 72 for lifting and lowering carrier table 2 and a guide plate 52 having a guide hole 53 for guiding guide rod 54.

Table lifting mechanism 72 includes a screw rod 45 provided in a lengthwise direction, a bearing 57 and a holding plate 43 fixed to moving frame 4 for rotatably holding an upper end and a lower end of screw rod 45 respectively, a nut 46 having a screw hole which engages with screw rod 45 and fixed to carrier table 2, and a screw rod rotating mechanism 75 for rotating screw rod 45.

Screw rod rotating mechanism 75 includes a motor 47 mounted on holding plate 43, a pulley 44 fixed to a rotation axis of motor 47, a pulley 48 fixed to a lower end of screw rod 45, and a transmission belt 50 installed over pulleys 44 and 48. A cover 51 for shielding wafers from dust generated by screw rod 45 and nut 46 is provided around screw rod 45 of carrier table 2.

Table sliding mechanism 73 includes a motor 35 fixed on bottom plate 34 below wafer rotating mechanism 71, a pulley 36 fixed to a rotation axis of motor 35, a pulley 37 provided rotatably below wafer holder 6 at the same height as pulley 36, a belt 38 installed over pulleys 36 and 37, a rail 39 provided on bottom plate 34 between pulley 36 and pulley 37, a fixing member 42 for affixing moving frame 4 one horizontal run of belt 38, and wheels 41, 41 provided on bottom plate 40 of moving frame 4, which wheels 41, 41 run on rail 39.

Wafer rotating mechanism 71 includes a shelf plate 96 fixed on an inner surface of a side plate of frame 33, a motor 27 fixed on shelf plate 96, a pulley 28 fixed to a rotation axis of motor 27, a pulley 29 provided at the same height as pulley 28, a wafer aligning roller 5 provided right above pulley 29 for rotating wafers in contact with peripheries of the wafers so that the crystallographic reference directions are aligned, a pulley 30 fixed to wafer aligning roller 5, and transmission belts 31, 32 respectively installed over pulleys 28 and 29, 29 and 30.

Wafer holder 6 includes a pair of main bodies 7 (refer to FIG. 4) in which grooves for holding lower peripheries of wafers are formed, a pair of posts 8 each of which at its upper end supports one of the main bodies 7, a pair of stands 10 each of which supports an individual one of the posts 8 at its lower end, and a wafer holder shifting mechanism 55 for changing the distance between wafer groups $W_1$, $W_2$ held by wafer holders 6 by moving the pair of wafer holders 6 relative to each other.

Figure 6:
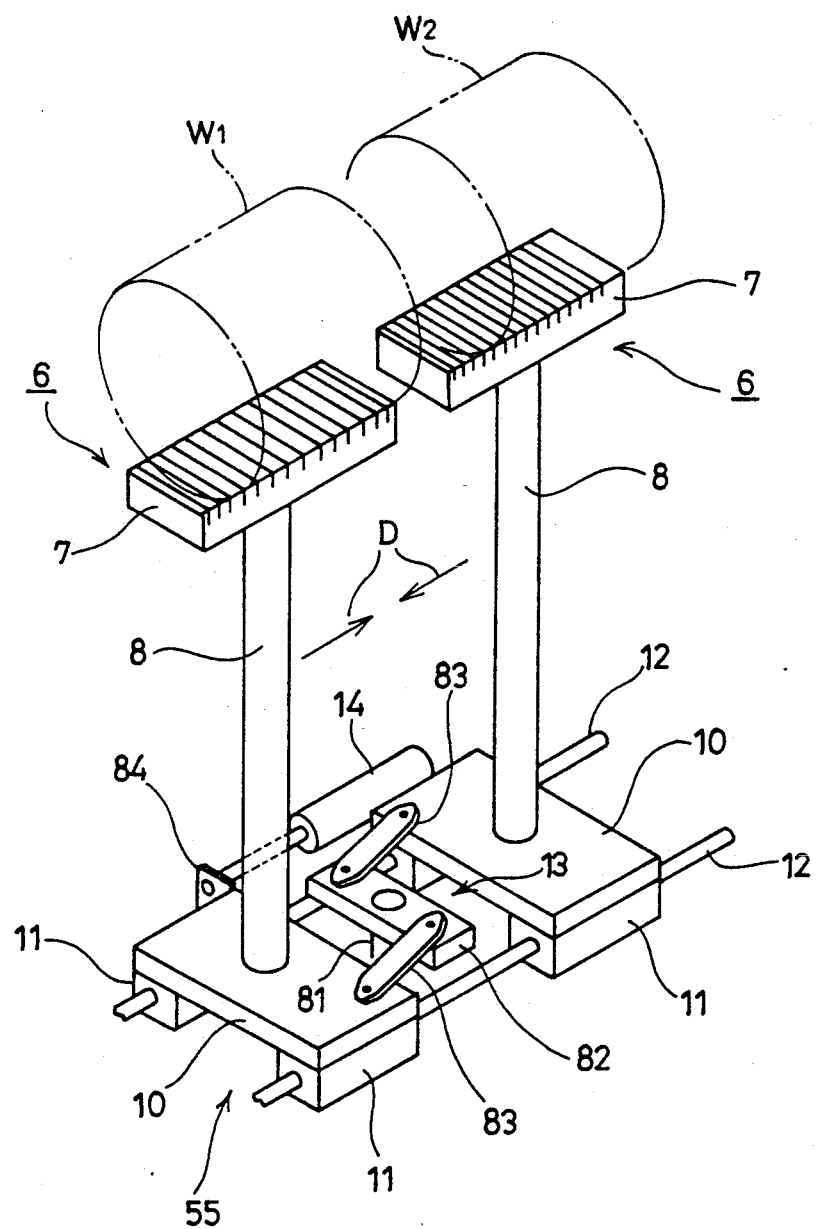
FIGS. 6 and 7 are perspective views of a wafer holder and a link mechanism of the apparatus according to the first embodiment.
Figure 7:
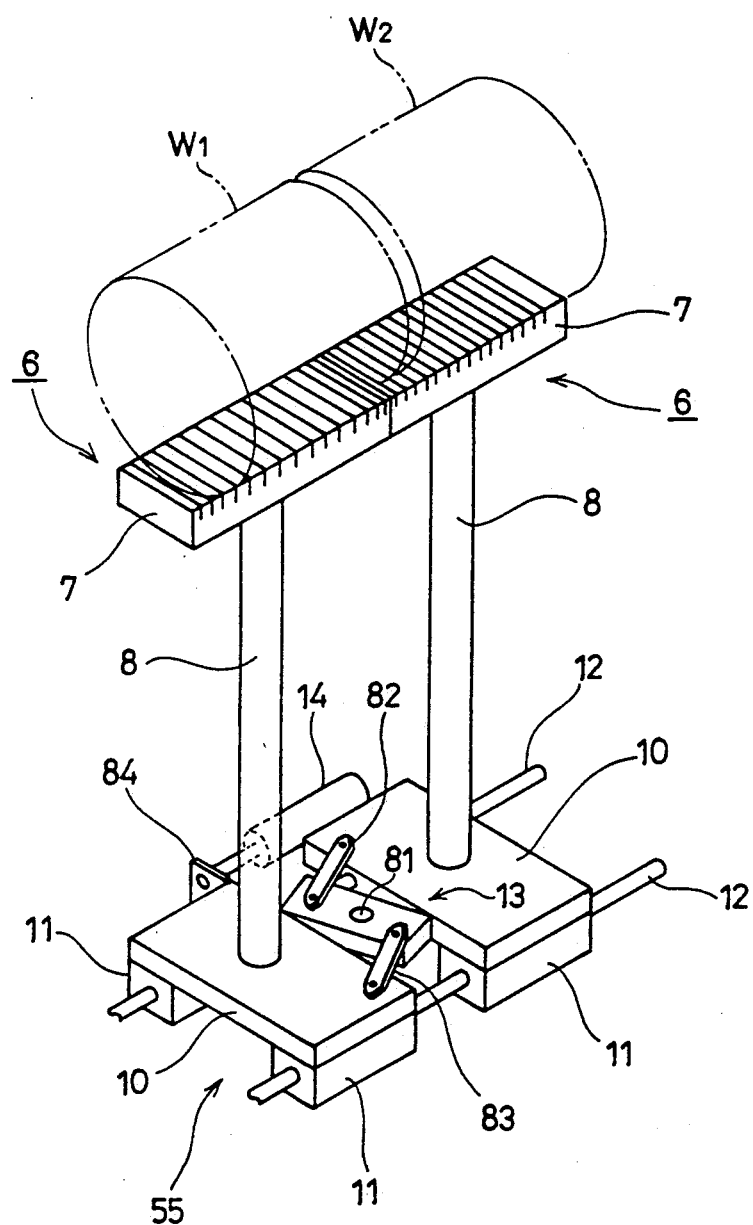

Referring to FIGS. 6 and 7, wafer holder shift mechanism 55 includes riders 11 respectively provided on both sides of lower surfaces of stands 10 and having through holes in which bearings and the like are provided, a pair of guide rails 12 each inserted into the through hole of one rider 11 of each of two stands 10, 10, a link 13 for coupling the pair of stands 10, 10 for movement parallel to the axes of guide rails 12 to move stands 10, 10 and away from each other, and an air cylinder 14 having its main body fixed to frame 33 through shelf plate 49 (refer to FIG. 5) and having its piston rod fixed to one of the stands 10, 10 with a member 84, respectively.

Link 13 includes a link plate 82 rotatably held around a center by a support rod 81, and a pair of link rods 83 disposed symmetrically about the support rod 81 and each having one end coupled to an upper surface of link plate 82 and the other end coupled to an upper surface of an individual stand 10 with pins.

Returning to FIG. 4, a rectangular opening 3 is formed in carrier table 2. Two wafer carriers 1 are located and carried on the upper surface of carrier table 2. An opening not shown is formed in a bottom surface of each wafer carrier 1. Distances among wafers W of each of wafer carriers 1 is a constant distance P (not shown in FIG. 4). The opening is formed having dimensions so that main bodies 7 of wafer holders 6 can pass therethrough.

Figure 8:
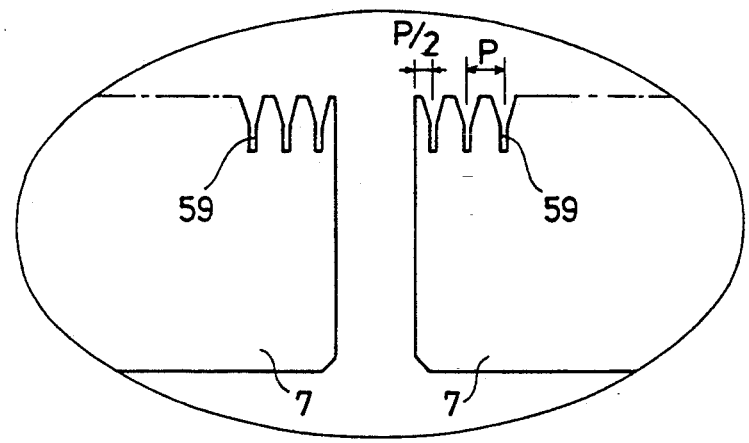
FIGS. 8 and 9 are partial enlarged views of a tip portion of a wafer holder.
Figure 9:
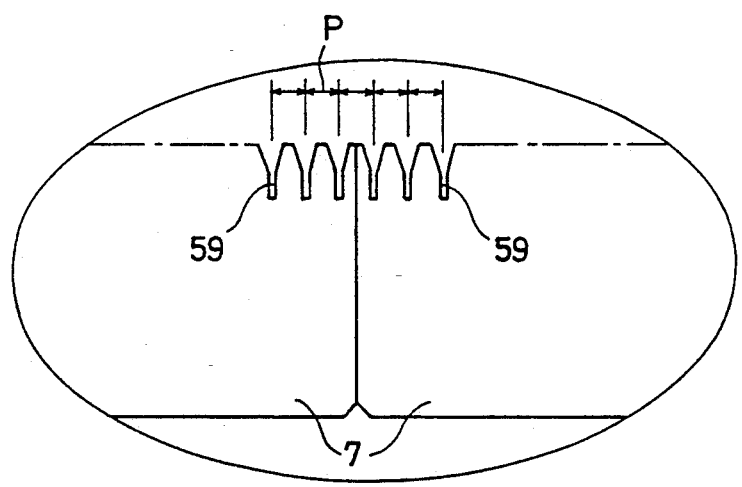

Referring to FIG. 8, a plurality of grooves 59 are formed for holding lower peripheries of wafers on the upper surface of main body 7 of the wafer holder 6. The number of the grooves 59 is equal to or larger than the number of wafers to be stored in each wafer carrier 1. Distances among respective grooves 59 are set to P. What should be noted is that a distance between a groove 59 which is the closest to an end facing to the other one and the end surface of main body 7 is P/2. This is made so that all grooves 59 are provided at equal intervals P as shown in FIG. 9 when main bodies 7 of wafer holders are in contact with each other.

Figure 1:
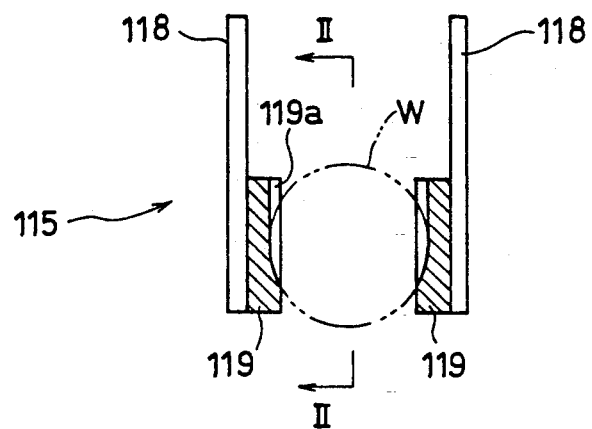
FIG. 1 is a front view of a wafer chuck used in a conventional apparatus and method.
Figure 2:
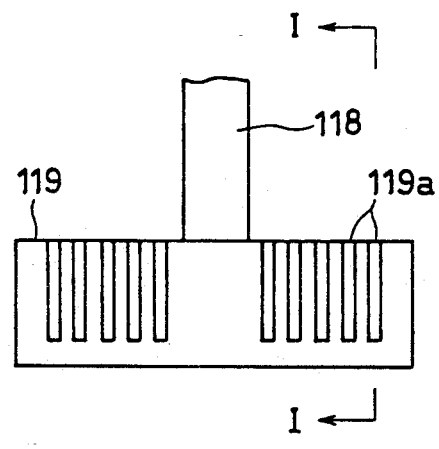
FIG. 2 is a diagram in the direction of the arrow taken along the line II—II of FIG. 1.
Figure 3:
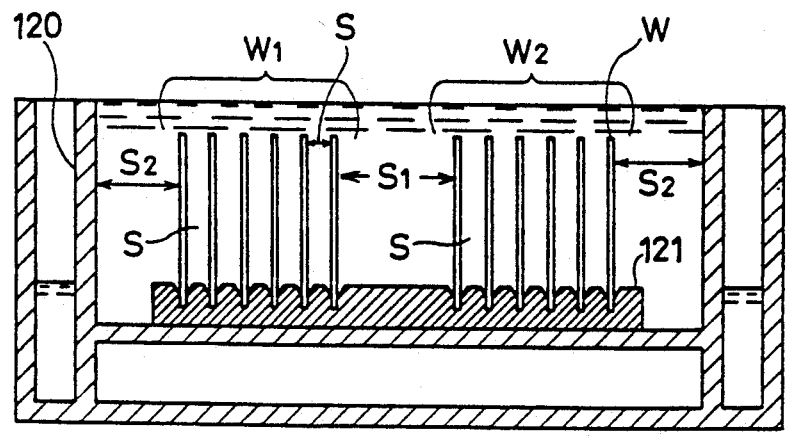
FIG. 3 is a cross-sectional view of a surface treatment bath and a wafer holding member used in the second method and apparatus of prior art.
Figure 4:
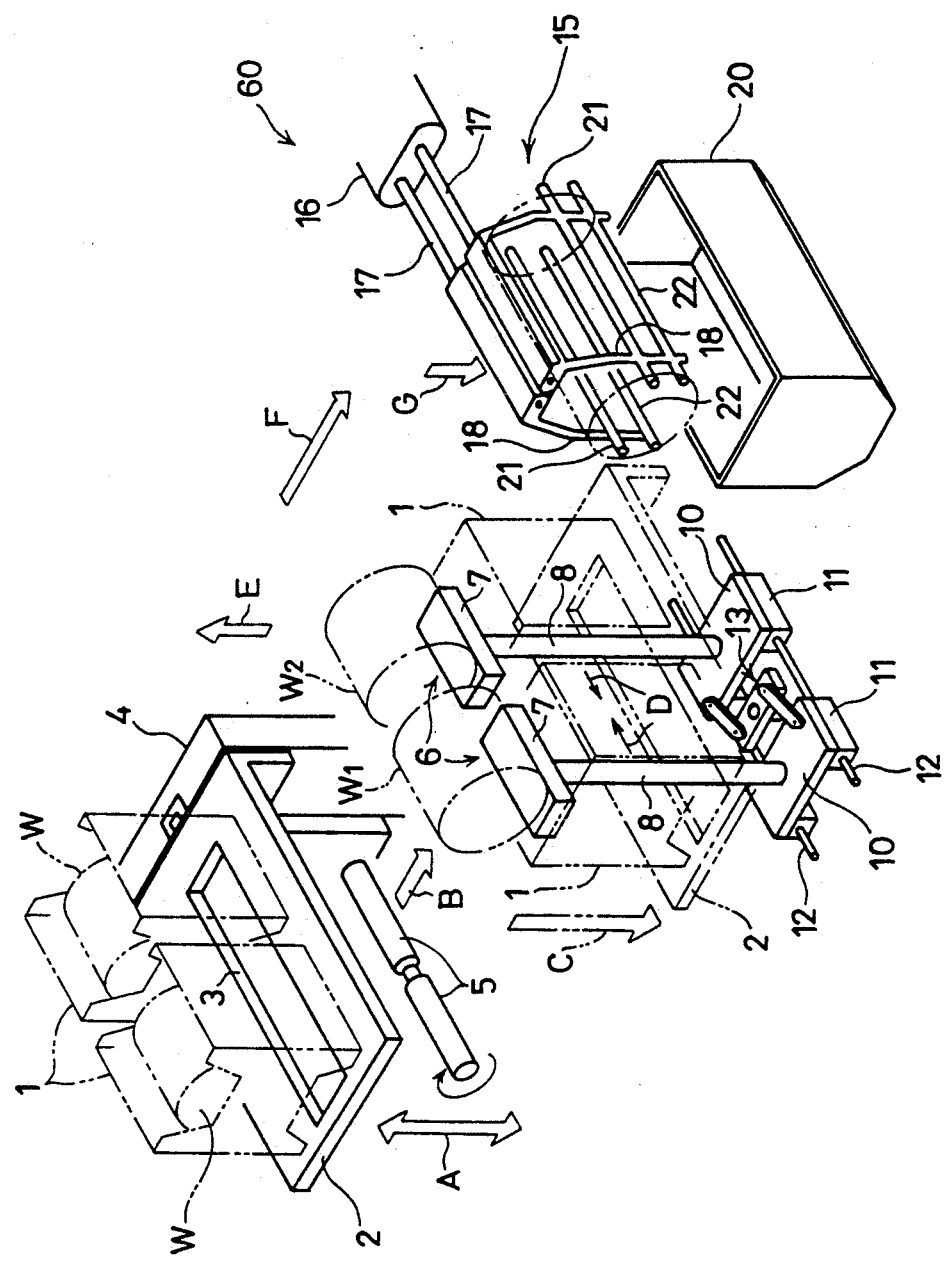
FIG. 4 is an exploded view illustrating the outline of one embodiment of a method and apparatus according to the present invention.
Figure 10:
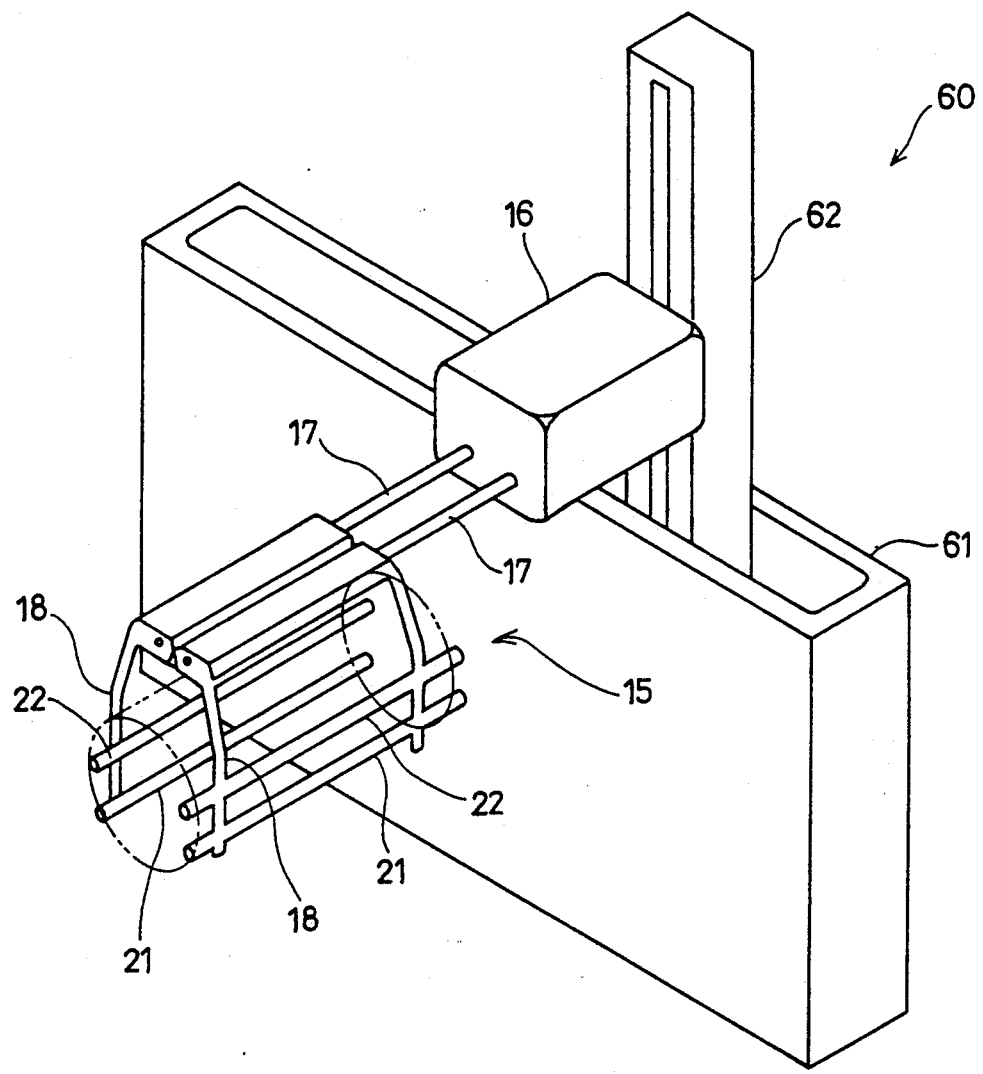
FIG. 10 is a perspective view of a wafer conveyor robot.

Referring to FIGS. 4 and 10, wafer conveyor robot 60 for conveying wafer groups $W_1$ and $W_2$ held by wafer holders 6 and shifted so that the distance between them is a predetermined interval P to dip them into a treatment solution has a structure as described below. Particularly referring to FIG. 10, wafer conveyor robot 60 includes a wafer chuck 15 for holding wafers therebetween, a head 16 having a driving mechanism therein for holding wafer chuck 15 and driving wafer chuck 15 to hold and release wafers, a column 62 for lifting and lowering head 16, and a transverse direction conveyor unit 61 for moving column 62 in a horizontal direction.

Wafer chuck 15 includes a pair of arm rods 17 held by head 16 parallel to each other and horizontally, and a pair of arms 18 each fixed to and below one end of arm rod 17.

The arms 18 include chuck hands 21 made of quartz for holding wafers W therebetween at their lowest portions, and chuck hands 22 made of quartz provided in parallel with chuck hands 21 above chuck hands 21 having grooves for supporting peripheries of wafers W held by chuck hands 21 so that the wafers W do not fall down.

Figure 12:
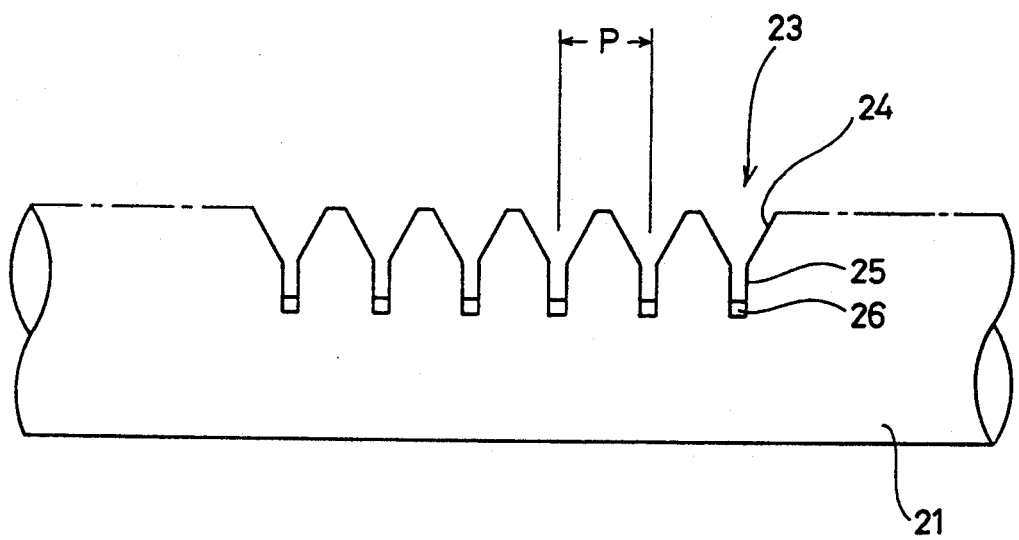
FIG. 12 is a side view of a chuck hand.

Referring to FIG. 12, a plurality of grooves 23 for holding wafers are formed at intervals P in chuck hand 21. The interval P is equal to the interval P of wafers held by wafer holding member 6. Each groove 23 includes tapering surfaces 24 formed on a surface of chuck hand 21, holding surfaces 25 which are substantially vertical to an axis of chuck hand 21 formed in a deeper portion than tapering surfaces 24, and a bottom surface 26 formed orthogonal to holding surface 25. Bottom surface 26 has two planes which meet at the center and incline outwards, respectively.

Figure 11:
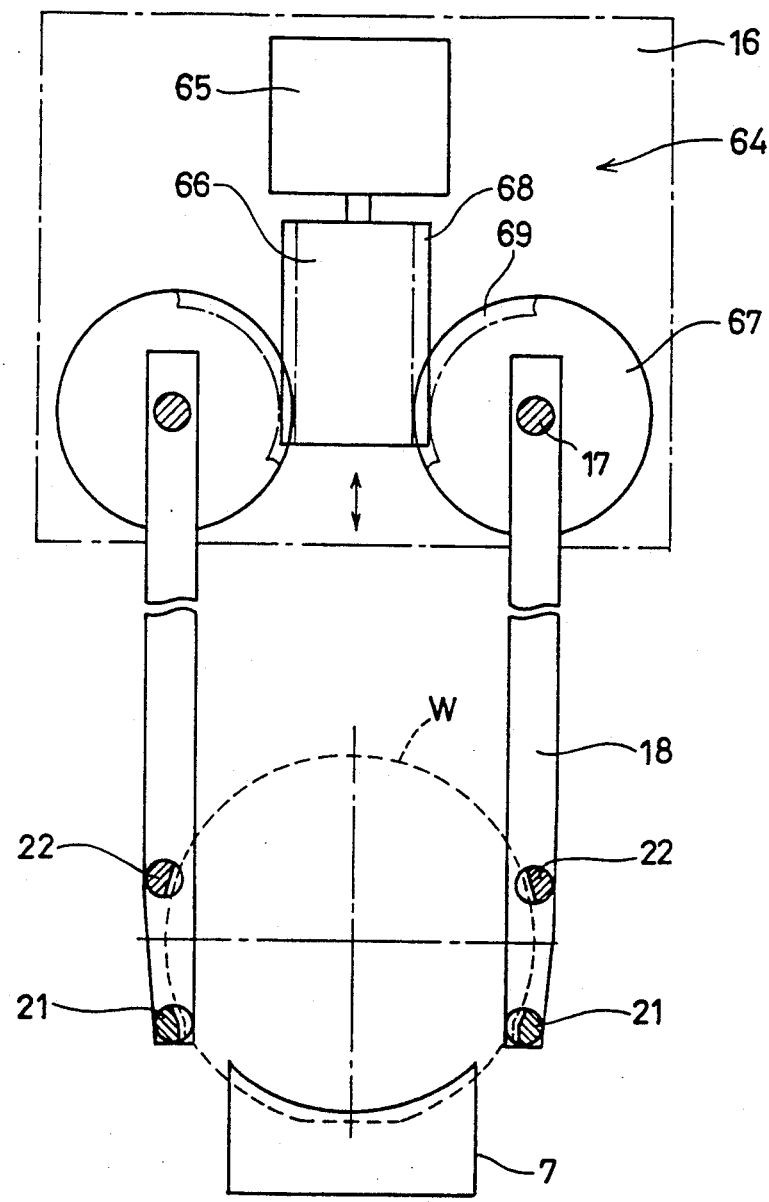
FIG. 11 is a schematic diagram illustrating the outline of an arm driving mechanism of a wafer conveyor robot.

Referring to FIG. 11, wafer chuck driver 64 accommodated in head 16 includes a pair of pinions 67 to which center axes arm rods 17 are fixed respectively, a rack 66 having teeth 68 on its both sides which engage with teeth 6 formed around respective pinions 67 and provided in the middle between pinions 67, and an actuator 65 for driving rack 66 upwards and downwards.

Referring to FIGS. 4 through 16, wafers W stored in two wafer carriers 1 are transferred to wafer conveyor robot 60 utilizing the mechanism previously described by moving frame 4 to the position in FIG. 5 in advance with motor 35, pulleys 36, 37 and belt 38 on the wafer rotating mechanism 71 side. Two wafer carriers 1 are positioned so that the axes of all wafers W coincide and wafers W are carried on wafer carrier table 2.

Alignment of wafers W in a crystallographic direction is achieved by rotating the output shaft of motor 47 shown in FIG. 5 in one direction, having rotating screw rod 45. Nut 46 threadably engaged with screw rod 45 is guided by teeth of screw rod 45 and moves downward. Accordingly, carrier table 2 to which nut 46 is fixed also moves downward as indicated by the arrow A as shown in FIG. 4. When carrier table 2 comes to a height at which wafer aligning roller 5 is in contact with arcuate portions of wafers W but not in contact with orientation flats, carrier table 2 is stopped. By rotating wafer aligning roller 5 using motor 27 shown in FIG. 5, wafers w rotate until the orientation flats face downward and peripheries of wafers W and wafer aligning roller 5 no longer contact each other. By stopping all the wafers W with their orientation flats facing downwards, the crystallographic reference directions of respective wafers W are aligned. After that, carrier table 2 rises to a position where it does not interfere with wafer aligning roller 5.

By operating motor 35 shown in FIG. 5, carrier table 2 is moved toward wafer holders 6 (shown by the arrow B in FIG. 4) together with moving frame 4, and is stopped at a position where opening 3 is located right above wafer holders 6. Operating motor 47 shown in FIG. 5 and rotating screw rod 45 in the opposite direction lowers carrier table 2 as shown by the arrow C in FIG. 4. Carrier table 2 stops when it comes to a position shown by the phantom line of FIG. 4. As carrier table 2 lowers, main body 7 in the upper portion of wafer holder 6 comes to protrude upwards from opening 3 of carrier table 2 and an opening of each wafer carrier bottom. When carrier table 2 moves below a certain height, the lower edges of wafer groups $W_1$ and $W_2$ stored in respective wafer carriers 1 are respectively inserted into grooves 59 formed on the upper side of main bodies 7 (refer to FIG. 8). Accordingly, at the point where carrier table 2 stops, all of the wafers inside groups $W_1$ and $W_2$ are held by main bodies 7 of wafer holders 6. At this time, intervals between wafers inside respective wafer groups $W_1$ and $W_2$ are the interval P as shown in FIG. 8, which is equal to intervals among wafers when they are stored in wafer carriers 1. The interval between wafer groups $W_1$ and $W_2$ is, however, larger than P.

Wafer groups $W_1$ and $W_2$ are shifted along guide rails 12 so that the distance between the two is equal to the interval P as follows. Particularly referring to FIGS. 6 and 7, a piston rod of air cylinder 14 is in the most extended state in advance. With wafer groups $W_1$ and $W_2$ held by wafer holders 6 respectively, the piston rod of air cylinder 14 is retracted by a predetermined length. Since the main body of air cylinder 14 is fixed to frame 33 (refer to FIG. 5), stand 10 whose mount member 84 slides toward link mechanism 13 being guided by guide rails 12. Link plate 82 rotates around the support rod 81 by an amount corresponding to travel of stand 10 which mounts member 84 because link plate 82 and this one of stands 10 are coupled together by link rods 83. With the rotation of plate 82, the other stand 10 also moves along guide rails 12 by the same distance and toward link plate 13 to which the other stand 10 is connected link rods 83. That is, the pair of wafer holders 6, 6 together shift in the direction indicated by arrows D in FIG. 6 as the piston rod of air cylinder 14 is retracted and the ends of main bodies 7 come into contact as shown in FIG. 7.

As shown in FIG. 8, among grooves 59 formed in an upper portion of main body 7, the distance between a groove closest to the end and the end surface of main body 7 is P/2. When the main bodies 7 are in contact with each other, the distance between grooves 59 located at the ends of respective main bodies 7 is equal to the interval P between adjacent ones of the other grooves 59 as shown in FIG. 9. Accordingly, all the wafers included in wafer groups $W_1$ and $W_2$ separately stored in wafer carriers 1 are aligned in one line at intervals P.

The wafers aligned at equal intervals as described above are transferred into treatment bath 20 from wafer holders 6 by wafer conveyor robot 60 as shown by the arrows E, F, G in FIG. 4 and subjected to surface treatment.

Referring to FIGS. 10 through 16, wafer conveyor robot 60 picks up wafers from wafer holders 6 (FIG. 10), by utilizing column 62 to left head 16 to a position where wafer chuck 15 and wafers held on wafer holders 6 do not interfere with each other. Transverse direction conveyor unit 61 moves column 62 and head 16 until wafer chuck 15 is located right above wafer holders 6.

Referring to FIG. 11, actuator 65 pushes down rack 66. As rack 66 lowers, pinion 67 rotates a predetermined amount. Arm rod 17 rotates together with pinion 67 to increase the interval between tip ends of arms 18. The operation of actuator 65 is stopped when chuck hands 21, 22 are separated so that they do not interfere with wafers W.

Figure 13:
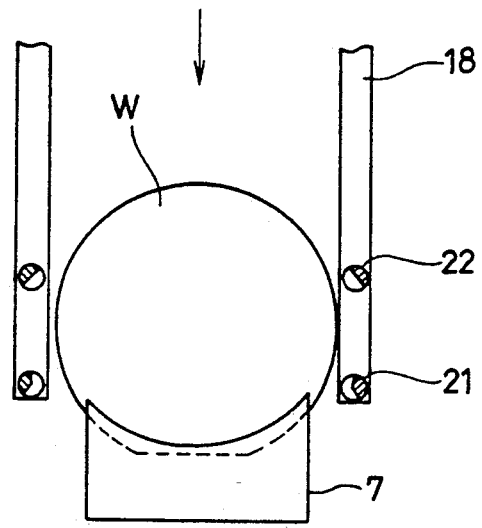
FIGS. 13–16 are schematic diagrams illustrating a process of holding wafer with a wafer conveyor robot.

Subsequently, head 16 is lowered to position wafer chucks 21 and 22 respectively to a predetermined height beside wafers W as shown in FIG. 13.

Figure 14:
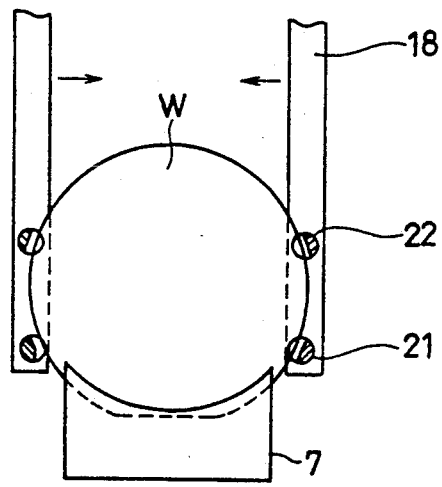

Next referring to FIG. 14, actuator 65 shown in FIG. 11 pulls up rack 66 to narrow down the interval between the lower ends of arms 18. Chuck hands 21 hold wafers W from both sides at their lower portions. As already described referring to FIG. 12, a plurality of grooves 23 are formed at intervals P in chuck hand 21. Accordingly, each of the wafers W is held in an individual groove 23 of chuck hands 21.

Upper portions of wafers W are also inserted into respective individual grooves of chuck hands 22. However, the grooves of chuck hands 22 are formed having dimensions so that they are not in contact with wafers W, or they do not pressure peripheries of wafers W toward the center even if they are in contact with wafers W when grooves 23 of chuck hands 21 are holding wafers W. That is, chuck hands 22 do not apply force to wafers W. Instead, respective grooves of chuck hands 22 prevent wafers W held by chuck hands 21 from falling down.

Figure 15:
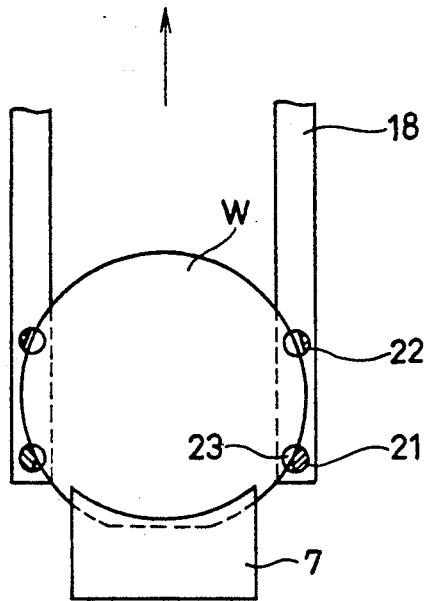
Figure 16:
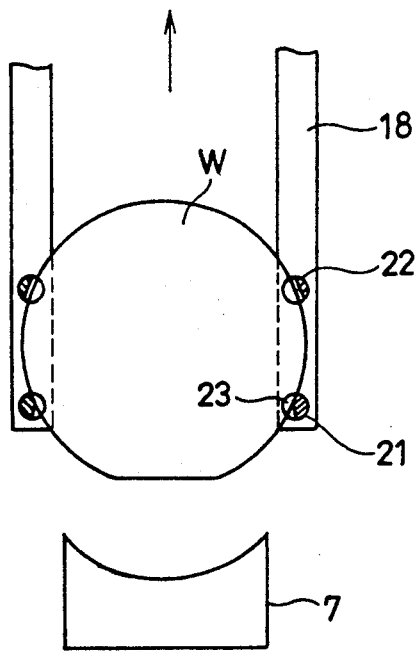

When chuck hands 21 and 22 hold all the wafers W as shown in FIG. 15, column 62 (refer to FIG. 10) lifts up head 16 to a position where arms 18 and wafers W do not interfere with main bodies 7 of wafer holders 6 as shown in FIG. 16.

By the process described above, all the wafers W on wafer holders 6 have been moved to wafer chuck 15 of the wafer conveyor robot.

Returning to FIG. 4, wafer conveyor robot 60 conveys wafers W to a position above and aligned with treatment bath 20 as shown by the arrow F. Then, as shown by arrow G, wafer conveyor robot 60 passes wafers W to a wafer holding member (not shown) in treatment bath 20. Under these condition, the wafers W are dipped into a predetermined treatment solution and stay therein for a predetermined time period. The surface treatment of wafers W is thus performed. After a predetermined time period has passed, wafer conveyor robot 60 retrieves wafers W from treatment bath 20 and transmits them to a following process. Otherwise, wafer conveyor robot 60 returns wafers W onto main bodies 7 of wafer holders 6 by going through the above-described processes in reverse.

As described above, wafers W separately stored in two wafer carriers 1 are transferred to wafer conveyor robot 60 together and subjected to surface treatment. This apparatus (FIGS. 4-16) differs from the prior art by utilizing mechanism 55 to shift wafer groups $W_1$ and $W_2$ so that the interval therebetween is equal to the interval P among respective wafers 55. Accordingly, the combined length of wafer groups decreases. The length of treatment bath 20 can also be reduced and the volume thereof is also reduced. The area required for installation of a surface treatment apparatus can be reduced. Also, intervals among wafers W which undergo surface treatment are uniform. The interval between wafer groups $W_1$ and $W_2$ which are transferred to wafer conveyor robot 60 from different wafer carriers 1 is never larger than the interval P among respective wafers. Therefore, when a uniform rising flow is formed by supplying a treatment solution into treatment bath 20 from bottom to top and overflowing the same from an opening at the upper portion to replace treatment solutions, for example, the flow of treatment solution will be always uniform inside treatment bath 20. Accordingly, surface treatment of wafers can be uniformly performed. Also, the length of treatment bath 20 can be reduced, and its capacity is reduced. Accordingly, the total amounts of surface treatment solution required in the treatment can be reduced. A decrease in the amount of treatment solution to be controlled facilitates control of temperature, concentration, and so forth, of the treatment solution.

In the embodiment described above, it should be noted that all of wafer holder shifting mechanism 55, table lifting mechanism 72 and table sliding mechanism 73 are provided lower than main bodies 7 of wafer holders 6. This is for preventing dust produced from these mechanisms from attaching to wafers W held by main bodies 7 of wafer holders 6. A surface treatment apparatus is usually provided inside a clean room where air is supplied from top to bottom. Therefore, dust produced from mechanisms provided below main bodies 7 of wafer holders 6 are brought away downwards on a down flow of air and prevented from going up.

The size of treatment bath 20 shown in FIG. 4 is selected so that each of intervals between inner end surfaces at both ends of bath 20 and surfaces of wafers located on both sides of a wafer train to be dipped therein are equal to the interval P between wafers W. By selecting the size of treatment bath 20 like this, occurrence of an uneven flow of treatment solution in treatment bath 20 is further reduced to enable uniform surface treatment of wafers W.

Figure 17:
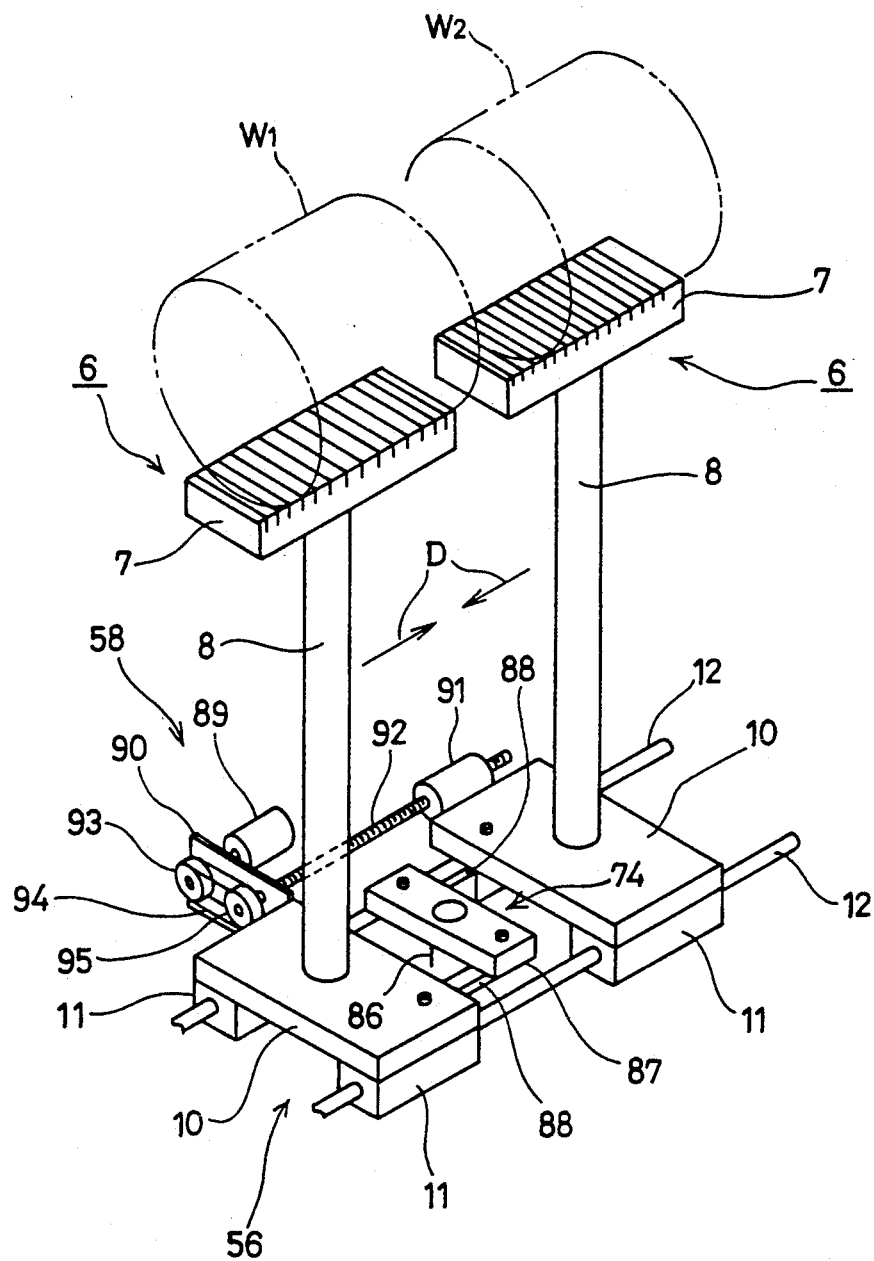
FIGS. 17 and 18 are perspective views of a wafer holder, and a link mechanism and a driving mechanism of link of an apparatus according to a second embodiment of the present invention.
Figure 18:
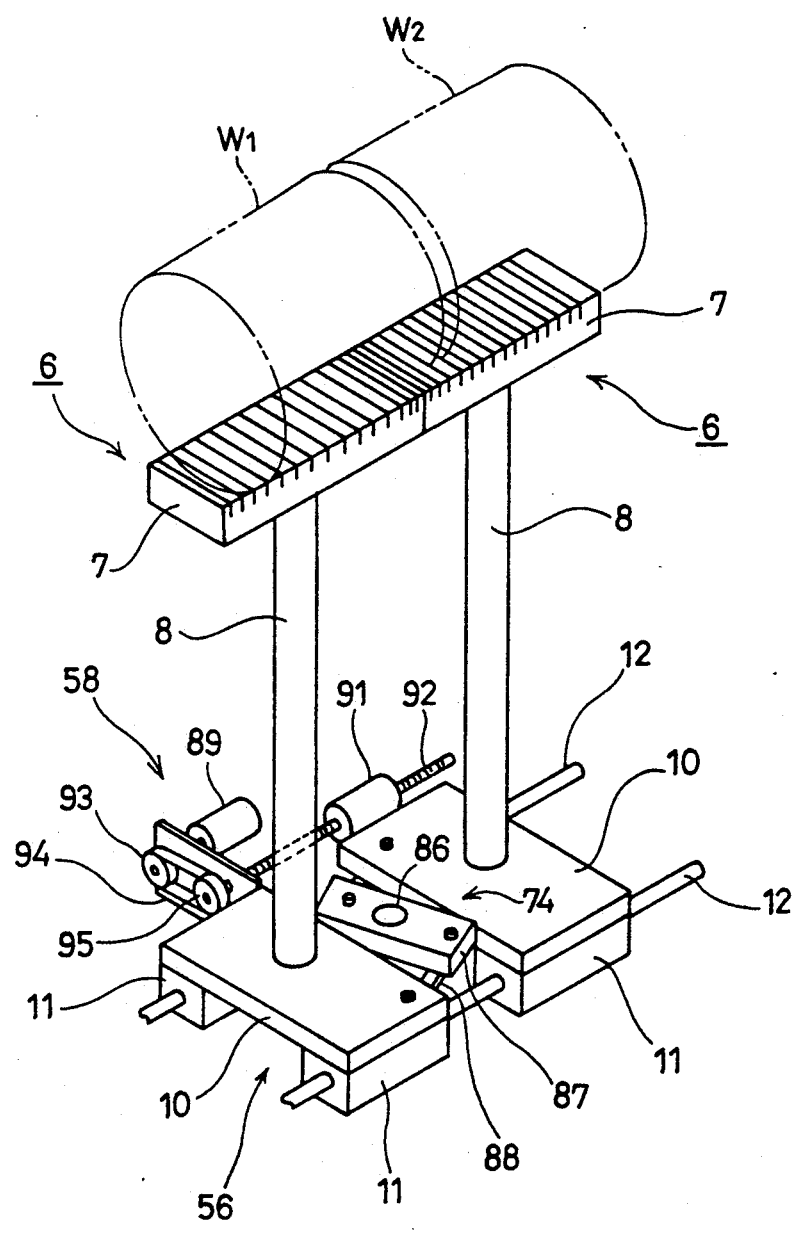

FIGS. 17 and 18 are perspective views of wafer holders 6 according to the second embodiment of an apparatus of the present invention and a wafer holder shifting mechanism for closing and separating wafer holders 6 to and from each other of another example. Other portions in the second embodiment are the same as those of the first embodiment shown in FIG. 5. Accordingly, detailed description thereof is not repeated herein.

Referring to FIG. 17, wafer holders 6 of the second embodiment include, similarly to the wafer holders of the first embodiment, a pair of posts 8, main bodies 7 fixed to upper ends of posts 8 respectively. Grooves for holding wafer groups $W_1$ and $W_2$ are formed on the upper surfaces of bodies 7. A pair of stands 10 for fixedly supporting posts 8 respectively. A wafer holder shifting mechanism 56 is provided for shifting the pair of stands 10 to close or separate them to and from each other.

Wafer holder shift mechanism 56 includes riders 11 provided on both sides of lower surfaces of respective stands 10, a pair of guide rails 12 each inserted into one of the riders 11 of two stands 10, a link means 74 for coupling riders 10 so that they can get closer to and separated from each other and a driving mechanism 58 for driving stands 10 closer to and separated from each other.

Link means 74 includes a support rod 86 disposed at the center between the pair of stands 10, a link plate 87 rotatably mounted around its center by support rod 86, and a pair of link rods 88 symmetrically provided around support rod 86 and respectively coupled to lower surfaces of different sides of stands 10 and the lower surface of link plate 87 at their both ends by pins.

Driving mechanism 58 includes a nut 91 side surface of one of the pair of stands 10, a member 90 fixed to the same side as nut 91 in the other stand 10, a screw rod 92 rotatably held by a bearing of member 90 at its one end and threadably engaging with nut 91, a pulley 95 fixed to one end on the member 90 side of screw rod 92, a motor 89 mounted to member 90 through a bearing, a pulley 93 fixed to the free end for the shaft of motor 89, and a transmission belt 94 wound over pulleys 93 and 95.

The wafer holder shifting mechanism 56 shown in FIG. 17 operates as described below. When wafer groups $W_1$ and $W_2$ are held on upper surfaces of main bodies 7 of wafer holders 6, respectively, motor 89 is actuated to rotate screw rod 92 in a predetermined direction, to exert a force to drive nut 91 relative to member 90 in a direction so that they get closer to each other. Since respective stands 10 are slidable on guide rails 12, they move respectively in directions of the arrows D while nut 91 moves on screw rod 92. At this time, link plate 87 of link 74 rotates counterclockwise when viewed from above by an angle corresponding to the traveled amount of stands 10. The distance between link plate 87 and stand 10 is restricted by link rod 88 so that stands 10 travel equal distances as they move to positions of FIG. 18 in which end surfaces of main bodies 7 of wafer holders 6 are in contact with each other at a center between them.

In order to separate wafer holders 6, motor 89 may be rotated in an opposite direction.

The second embodiment is characterized in that both of link rods 88 of the link mechanism are provided on lower surfaces of stands 10. It is necessary to prevent dust from attaching to wafers, so that it is preferred to separate a link mechanism and so forth which may produce dust away from main bodies 7 of wafer holders 6 as far as possible. It is also effective to cover the entire wafer holder shifting mechanism 56 for the same purpose.

Figure 19:
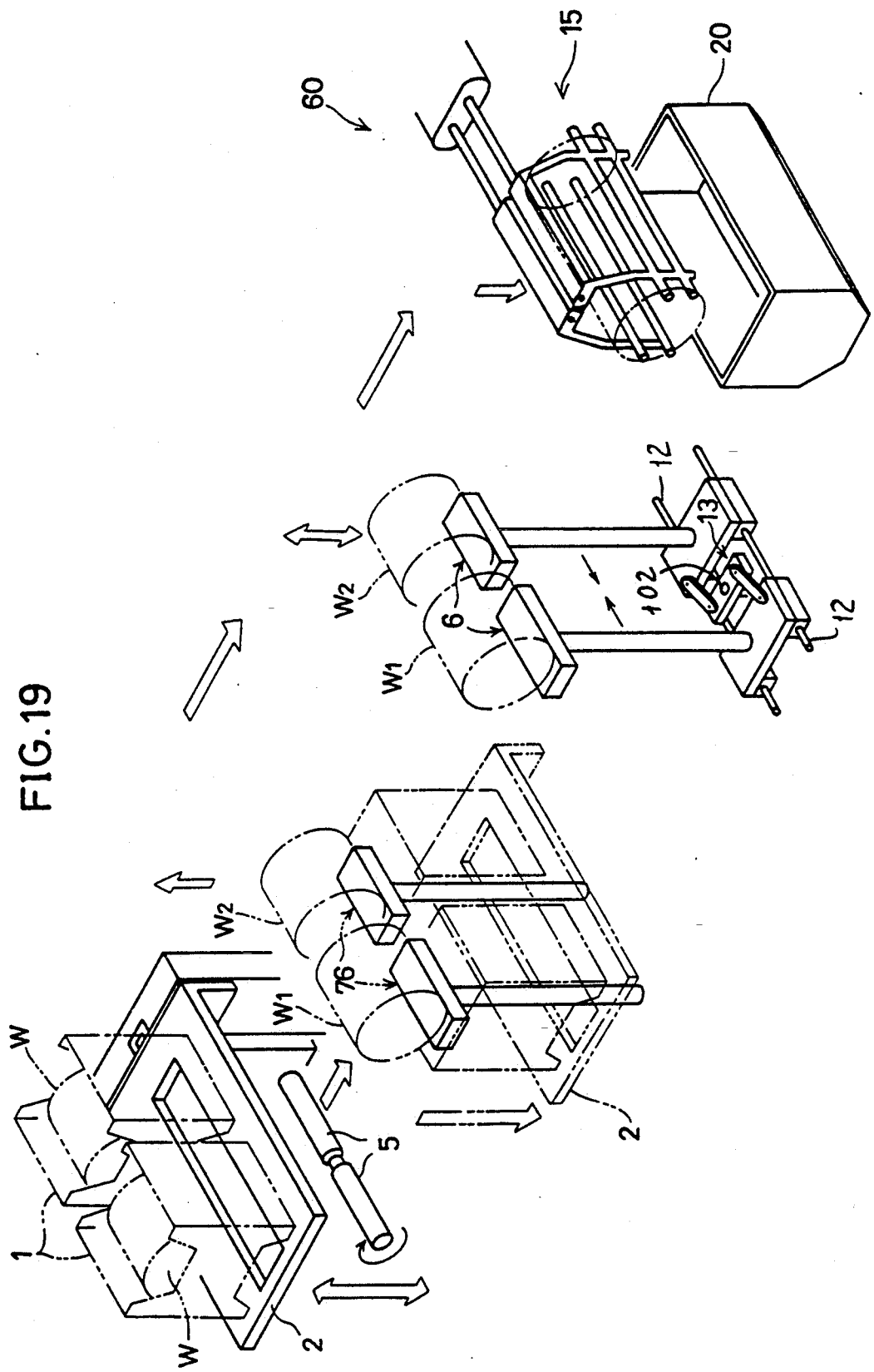
FIG. 19 is a perspective view of an apparatus according to a third embodiment of the present invention.

FIG. 19 is a schematic in perspective of a wafer transferring apparatus according to the third embodiment of the present invention. Referring to FIG. 19, the wafer transferring apparatus of the third embodiment is different from the wafer transferring apparatus of the first embodiment in that, between the pair of wafer holders 6 provided with a wafer holder shifting mechanism 55 and the wafer rotating mechanism 71 of the first embodiment, it has fixed wafer holders 76 without a wafer holder shifting mechanism being provided for the sole purpose of removing wafer groups $W_1$, $W_2$ from wafer carriers 1. In this apparatus of FIG. 19, a wafer conveyor robot 60 is used for sequentially conveying wafers from wafer holders 76, 6, to a treatment bath 20. Otherwise, wafers may be conveyed by another wafer conveyor robot from the wafer holders 76 to the wafer holders 6.

The apparatus of the third embodiment shown in FIG. 19 is the same as the apparatus of the first embodiment except that fixed type wafer holders 76 are newly provided. Corresponding parts are allotted with the same reference characters. Names and functions thereof are also the same. Accordingly, detailed description thereof are not repeated herein.

Also in the wafer transferring apparatus according to the third embodiment, wafers W which are supplied to a surface treatment process while being stored in separate wafer carriers 1 are aligned so that intervals between respective wafers are equal to a constant interval P, and then dipped into a treatment solution inside treatment bath 20. Therefore, conventional problems can also be solved as in the first embodiment.

Methods and apparatus according to the present invention have been described in detail on the basis of embodiments above. However, the present embodiment is not limited to the above-described embodiments. For example, modifications of the present invention as follows are also proposed.

Figure 20:
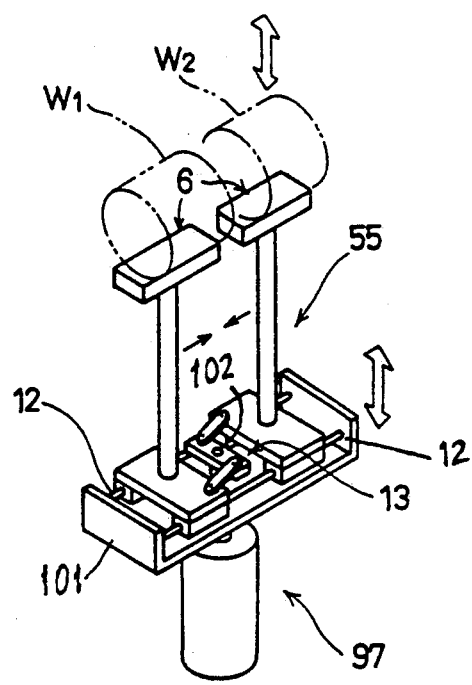
FIG. 20 is a perspective view of wafer holders according to a fourth embodiment of the present invention.

(1) Mechanisms for lifting and lowering a carrier table 2 are provided in any of the above-described embodiments. However, in place of such a lifting mechanism, it is also a possibility to lift and lower wafer holders 6 themselves shown in FIG. 4 with the table 2 being fixed in height. One example thereof is shown in FIG. 20. Referring to FIG. 20, this apparatus further includes an air cylinder 97 provided below wafer holders 6 and a wafer holder shifting mechanism 55 for driving the entirety up and down. A guide rail holding member 101 is fixed to the upper end of the piston rod for air cylinder 97, and both ends of a pair of guide rails 12 are held by the upwardly turned ends of member 101. A post 102 of a link mechanism 13 is also fixed on the member.

As described above, by driving wafer holders 6 themselves up and down using air cylinder 97, wafers inside wafer carriers can also be transferred onto wafer holders 6. Furthermore, an interval between wafer groups $W_1$ and $W_2$ can be narrowed down to a predetermined interval P by wafer holder shifting mechanism 55, where the same effect can be obtained as the above-described first through third embodiments.

Otherwise, it is also suggested to provide a lifting mechanism such as an air cylinder (not shown) on an upper end of post 8 and move main bodies of wafer holders 6 up and down with the lifting mechanism.

(2) As a mechanism for mutually closing and separating stands 10, besides such mechanisms as shown in FIGS. 6 and 7 or FIGS. 17 and 18, a motor or the like may be provided for rotating support rods 81 (FIG. 6) and 86 (FIG. 17) of link means 13 and 74, respectively. In any of the above-described embodiments, stands 10 move by the same distance in opposite directions. However, the present invention is not limited to the same, and it can be also supposed to fix one stand and move only the other stand.

(3) Shapes of chuck hands 21 and 22 of wafer chuck 15 can be variously modified from that shown in the above-described embodiments as long as it satisfies the condition that all wafers W can be held at the same intervals P. Although chuck hands 21 and 22 formed of quartz have been suggested in the above-described embodiments, they can be formed of fluororesin or other antichemical material such as SiC, PEEK (polyetereterketone), pp (polypropylene), for example.

(4) A holder for supporting wafers in treatment bath 2 is provided in the above description. However, the present invention is not limited to the same, and wafers W can be dipped into a treatment solution while being held by wafer chuck 15.

(5) In the above embodiments, description has been given mainly to transferring wafers W taken out of wafer carriers 1 to a wafer conveyor robot. However, the present invention is not limited to the same, and it can also be applied to a system for removing wafers W from a treatment bath and utilizing a wafer conveyor robot into a wafer carrier for storage.

(6) In the above embodiments, wafers are subjected to surface treatment by a liquid. However, the present invention is not limited to the same, and it can be applied to a system for vapor-treating wafer surfaces. That is, instead of treatment bath 20, the instant invention can be practiced by utilizing general surface treatment apparatus that includes a surface treatment chamber and the like.

(7) In the preceding description, embodiments have been described in which a uniform rising flow of surface treatment solution is formed inside a treatment bath 20 in the wet treatment thereby uniformly treating wafer surfaces. However, the present invention is not limited to the same, and it can also be applied to apparatus in which a down flow of surface treatment solution is formed or in which a rising flow or a down flow of vapor of surface treatment solution is formed and wafer surfaces are treated with the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of holding and conveying wafers from a plurality of transmittable wafer storing means to a processor where wafers are subjected to a surface treatment process by utilizing a wafer conveyor means, said wafer storing means storing wafer groups each including a predetermined plurality of wafers that are substantially parallel to each other in face-to-face relationship and spaced from each other by predetermined first intervals along a first axis that is generally at right angles to faces of said wafers, all the wafers being stored in at least one of said plurality of wafer storing means, said method comprising the steps of:

aligning the wafer groups stored in said wafer storing means on a predetermined straight line while maintaining relative positional relationship between wafers in each of said wafer groups so that said axes of respective said wafer storing means coincide with each other and a second interval larger than said first interval exists along said first direction between respective said wafer groups;

shifting at least one of said wafer groups along said first axis until the interval between said aligned wafer groups along said first axis becomes equal to said first interval; and holding said shifted at least one of said wafer groups by utilizing said wafer conveyor means;

said step of aligning said wafer groups comprising the steps of:

holding said plurality of wafer storing means by supporting means so that axes of respective said wafer groups are parallel to each other and a distance measured parallel to said first axis between respective wafer groups is said second interval, and extracting the wafer groups from inside said wafer storing means while the latter are supported by said supporting means and maintaining relative positional relation among wafers in each wafer group after extracting same from each of said plurality of wafer storing means so that axes of respective wafer groups coincide with each other;

said step of supporting said plurality of wafer storing means by the supporting means comprises a step of supporting said wafer storing means by said supporting means so that axes of respective said wafer groups coincide with each other and a distance on said axes between respective wafer groups is said second interval;

each said storing means comprising:

a substantially rectangular bottom side having two long sides parallel to said first axis and having an opening exposing bottom edges of all the wafers of said wafer group stored in said wafer storing means, two holding sides provided parallel to each other and along said long sides of said bottom side for holding said wafers, and an opening side disposed opposite said bottom side and through which said wafer group can pass;

said supporting sides comprising the same number of wafer holding grooves as the number of wafers included in said wafer group formed at said first intervals on surfaces opposing to each other for supporting side edges of said wafers.

2. The method according to claim 1, wherein said supporting means comprises a table on which said plurality of wafer storing means are carried, said table having an opening having a size which allows viewing, through the openings of said bottom sides, all the wafers within said plurality of wafer storing means carried on said table, and the step of supporting means comprises a step of positioning said plurality of wafer storing means on said table so that said opening of said bottom side of each of said wafer storing means faces the opening of said table and axes of said plurality of wafer storing means coincide with each other.

3. The method according to claim 2, wherein the step of extracting from said plurality of wafer storing means the wafer groups inside said wafer storing means supported by said supporting means comprises, a step of positioning below the opening of said table a plurality of wafer retaining means capable of shifting parallel to said first axis, said wafer retaining means having wafer accommodating grooves formed at said first intervals on their upper surfaces for accommodating bottom edges of said wafers and for holding the wafers stored in respective said wafer storing means by said wafer holding grooves so that the respective wafers are maintained spaced by said first intervals and parallel to each other, and a step of changing the relative height of said table and said wafer retaining means so that each said wafer retaining means engages each wafer group stored in each said wafer storing means through the opening of said table and the bottom side of said wafer storing means and lifts up the wafer groups to a predetermined height out of said wafer storing means through its said opening side, and wherein said wafer accommodating groove adjacent an end opposing to one another one of said wafer retaining means of each said wafer retaining means is formed at a position at which its center is spaced from said end by a distance no greater than half said first interval.

4. The method according to claim 3, wherein the step of changing relative height of said table and said wafer retaining means comprises a step of lowering said table using table lifting means until an upper surface of said wafer retaining means is located above said opening side of said wafer storing means.

5. The method according to claim 4, wherein the step of moving at least one of said wafer groups along said first direction comprises a step of shifting at least one of said wafer retaining means along said first direction so that wafer accommodating grooves thereof formed adjacent to each other at ends facing each respective said wafer holding means are spaced from each other by said first interval.

6. The method according to claim 5, wherein said wafer conveyor means comprises, a pair of wafer holding means having a number of wafer accommodating grooves for accommodating edges of the wafers equal to at least the number of all the wafers stored in said plurality of wafer storing means respectively formed at said first intervals, first driving means for holding said pair of wafer holding means in parallel with said first direction so that respective said wafer accommodating grooves face each other to define planes perpendicular to said first direction and driving said pair of wafer holding means so that a distance between said pair of wafer holding means changes between a first distance at which bottoms of said wafer accommodating grooves hold the edges of said wafers and a second distance at which the bottoms of said wafer accommodating groups release the edges of said wafers, and second driving means for driving said first driving means in longitudinal and transverse directions, and said step of holding said shifted wafer groups with said wafer conveyor means comprises the steps of:

positioning said pair of wafer holding means at a position at which said pair of wafer holding means does not interfere with said wafer storing means on said table so that distances from said axis of said wafer storing means provided on said table and each of said pair of wafer holding means are equal to each other, positioning said pair of wafer holding means by said first driving means so that a distance therebetween is said second distance, lowering said pair of wafer holding means by said second driving means to a position at which said pair of wafer holding means can hold said wafers which are aligned, retained and shifted by said wafer retaining means, holding said wafers with said pair of wafer holding means by positioning the lowered said pair of wafer holding means by said first driving means so that a distance therebetween is said first distance, and raising said pair of wafer holding means holding said wafers therebetween by said second driving means up to a position at which said wafer storing means provided on said table does not interfere with said pair of wafer holding means and then conveying the same to a following process.

7. An apparatus for holding and transferring wafers from a plurality of transmittable wafer storing processor to a wafer surface treatment means, each of said wafer storing means storing an individual wafer group including a predetermined plurality of wafers that are substantially parallel with each other and spaced apart at predetermined first intervals along a first axis, all the wafers being stored in at least one of said plurality of wafer storing means, a wafer conveyor means for conveying the wafers to said wafer surface treatment processor; said apparatus comprising means for aligning the wafer groups stored in said wafer storing means on a predetermined straight line while maintaining relative positional relation among wafers inside each of said wafer groups so that said axes of each of said wafer groups coincide with each other, there being a second interval along the first axis between each of said wafer groups, said second interval being larger than said first interval, and shifting means for shifting at least one of said wafer groups along said first axis so that an internal in said first direction between said aligned wafer group equals said first interval;

said wafer means comprising:

supporting means for supporting said plurality of wafer storing means so that said axes of each of said wafer storing means are parallel to each other and a distance in said first direction between each of the wafer groups is said second interval, and wafer group extracting means for taking the wafer groups inside said wafer storing means supported by said supporting means out of each of said plurality of wafer storing means while maintaining relative positional relationship among wafers inside each wafer group so that axes of each of the wafer groups coincide with each other;

said plurality of wafer storing means being supported by said supporting means so that said axes of each of said wafer storing means coincide with each other and a distance on said axis between each of said wafer groups is said second interval;

each of said wafer storing means comprising a substantially rectangular bottom side having an opening facing bottom edges of all the wafers of said wafer group stored in said wafer storing means and having two long sides parallel to said first direction, two holding sides for holding said wafers provided parallel with each other along said long sides of said bottom side, and an opening side provided opposite said bottom side through which said wafer group can pass;

each of said holding sides having the same number of wafer holding grooves as the number of wafers included in said wafer group for respectively supporting side edges of said wafers formed at said first intervals on the surfaces of said holding sides that face each other.

8. The apparatus according to claim 7, wherein
said supporting means includes a table having an opening on which said plurality of wafer storing means are supported,
said opening of said table having a lengthwise dimension that exceeds the end to end distance of the wafers of said plurality of wafer storing means which are provided in end to end alignment on said table, and
said supporting means includes means for positioning said plurality of wafer storing means on said table so that said opening of said bottom side of each said wafer storing means faces the opening of said table and the axes of said plurality of wafer storing means coincide with each other.

9. The apparatus according to claim 8, wherein
said wafer group extracting means comprises:
a plurality of wafer retaining means shiftable parallel to said first axis and normally being below the opening of said table, and on their upper surfaces having wafer accommodating grooves for accommodating bottom edges of said wafers, said accommodating grooves being formed at said first intervals and being provided for holding the wafers stored in said wafer storing means so that respective wafers maintain said first intervals and are parallel with each other, and
lifting means for changing relative height of said table and said wafer retaining means between a first position where said table and said wafer retaining means do not interfere with each other and a second position where each of said wafer retaining means passes through the opening of said table and the opening of the bottom side of said wafer storing means, and holds and lifts the wafer group stored in each of said wafer storing means up to a predetermined height outside said wafer storing means from said opening side, and
said wafer accommodating groove adjacent an end of each of said wafer retaining means which faces another one of said wafer retaining means is formed at a position where its end is spaced apart by a distance from said end which is no more than half of said first interval.

10. The apparatus according to claim 9, wherein said lifting means includes table lifting means for lifting and lowering said table between said second position where the upper surface of said wafer retaining means is positioned above said opening side of said wafer storing means and said first position where the upper surface of said wafer retaining means is below the lower surface of said table and does not interfere therewith.

11. The apparatus according to claim 9, also including wafer retaining means, said lifting means being operatively connected for lifting and lowering said wafer retaining means between said second position where the upper surface of said wafer retaining means is positioned above said opening side of said wafer storing means and said first position where the upper surface of said wafer retaining means is below the lower surface of said table and does not interfere therewith.

12. The apparatus according to claim 8, wherein said wafer group extracting means comprises:
a plurality of wafer retaining means capable of being arranged below the opening of said table and each having on its upper surface wafer accommodating grooves for accommodating bottom edges of said wafers respectively formed at said first intervals for retaining the wafers stored in said wafer storing means in said wafer accommodating grooves so that respective wafers are maintained in parallel with each other and spaced apart by said first intervals,
lifting means for changing the relative height of said table and said wafer retaining means between a first position where said first wafer retaining means do not interfere with said table and a second position wherein said first wafer retaining means hold and lift wafer groups stored in said wafer storing means by passing said first wafer retaining means through the opening of said table and the bottom side of said wafer storing means up to a predetermined height outside said wafer storing means from said opening side, and wherein
said wafer accommodating groove adjacent an end of each said first wafer retaining means which faces another one of said first wafer retaining means is formed at a position where it is spaced from said end by no more than half said first interval.

13. The apparatus according to claim 12, wherein said lifting means comprises table lifting means for lifting and lowering said table between a position where the upper surface of said first wafer retaining means is above said opening side of said first wafer storing means and a position where the upper surface of said first wafer retaining means does not interfere with said table.

14. The apparatus according to claim 13, wherein
said wafer conveyor means has a length capable of retaining all the wafers in said wafer groups arranged at said second intervals, and
said shifting means comprises
a plurality of second wafer retaining means shiftable in said first direction, arranged in parallel with said first wafer retaining means, and each having on its upper surface wafer accommodating grooves for accommodating bottom edges of said wafers, said accommodating grooves being formed at said first intervals for retaining the wafers stored in said wafer storing means in said wafer accommodating grooves so that respective wafers are maintained in parallel with each other and spaced apart by said first intervals, and
means for shifting at least one of said second wafer retaining means parallel to said first axis so that the wafer accommodating grooves formed adjacent ends facing each other of each of said second wafer retaining means are spaced by said first intervals,
said wafer accommodating groove adjacent the end facing another one of said second wafer retaining means of each said second wafer retaining means is formed at a position where its center is spaced from said end by no more than half said first interval, and
said wafer conveyor means can hold, convey and pass said wafers retained by said first wafer retaining means to said second wafer retaining means.

15. The apparatus according to claim 14, wherein said wafer conveyor means comprises
a pair of wafer holding means having a number of wafer accommodating grooves for accommodating edges of the wafers, equal to at least the number of all the wafers stored in said plurality of first wafer storing means respectively formed at said first intervals, first driving means for holding said pair of wafer holding means in parallel with said first direction so that said wafer accommodating grooves face each other to define planes perpendicular to said first direction and driving said pair of wafer holding means so that a distance between said pair of wafer holding means changes between a first distance at which the bottoms of said wafer accommodating grooves hold edges of said wafers and a second distance at which the bottoms of said wafer accommodating grooves release the edges of said wafers, and second driving means for driving said first driving means in longitudinal and transverse directions.

16. The apparatus according to claim 12, wherein said lifting means comprises first wafer retaining means, lifting means for lifting and lowering said first wafer retaining means between a position where the upper surface of said first wafer retaining means is above said opening side of said first wafer storing means and a position where the upper surface of said first wafer retaining means does not interfere with said table.

17. A method of holding and conveying wafers from a plurality of transmittable wafer storing means to a processor where wafers are subjected to a surface treatment process by utilizing a wafer conveyor means, said wafer storing means storing wafer groups each including a predetermined plurality of wafers that are substantially parallel to each other in face-to-face relationship and spaced from each other by predetermined first intervals along a first axis that is generally at right angles to faces of said wafers, all the wafers being stored in at least one of said plurality of wafer storing means, said method comprising the steps of:

aligning the wafer groups stored in said wafer storing means on a predetermined straight line while maintaining relative positional relationship between wafers in each of said wafer groups so that said axes of respective said wafer storing means coincide with each other and a second interval larger than said first interval exists along said first direction between respective said wafer groups;

shifting at least one of said wafer groups along said first axis until the interval between said aligned wafer groups along said first axis becomes equal to a predetermined interval shorter than said second interval; and holding said shifted at least one of said wafer groups by utilizing said wafer conveyor means;

said step of aligning said wafer groups comprising the steps of:

holding said plurality of wafer storing means by supporting means so that axes of respective said wafer groups are parallel to each other and a distance measured parallel to said first axis between respective wafer groups is said second interval, and extracting the wafer groups from inside said wafer storing means while the latter are supported by said supporting means and maintaining relative positional relation among wafers in each wafer group after extracting same from each of said plurality of wafer storing means so that axes of respective wafer groups coincide with each other;

said step of supporting said plurality of wafer storing means by the supporting means comprises a step of supporting said wafer storing means by said supporting means so that axes of respective said wafer groups coincide with each other and a distance on said axes between respective wafer groups is said second interval;

each said wafer storing means comprising;

a substantially rectangular bottom side having two long sides parallel to said first axis and having an opening exposing bottom edges of all the wafers of said wafer group stored in said wafer storing means, two holding sides provided parallel to each other and substantially perpendicular to said bottom side along said long sides of said bottom side for holding said wafers, and an opening side disposed opposite said bottom side and through which said wafer group can pass;

said supporting sides comprising the same number of wafer holding grooves as the number of wafers included in said wafer group formed at said first intervals on surfaces opposing to each other for supporting side edges of said wafers;

said supporting means comprising a table on which said plurality of wafer storing means are carried, and said table having an opening sized to allow viewing, through the openings of said bottom sides, all the wafers within said plurality of wafer storing means carried on said table; and said step of supporting by said supporting means comprising a step of positioning said plurality of wafer storing means on said table so that said opening of said bottom side of each of said wafer storing means faces the opening of said table and axes of said plurality of wafer storing means coincide with each other;

said step of extracting from said plurality of wafer storing means the wafer groups inside said wafer storing means supported by said supporting means comprising;

a step of positioning below the opening of said table a plurality of wafer retaining means capable of shifting parallel to said first axis, said wafer retaining means having wafer accommodating grooves formed at said first intervals on their upper surfaces for accommodating bottom edges of said wafers and for holding the wafers stored in respective said wafer storing means by said wafer holding grooves so that the respective wafers are maintained spaced by said first intervals and parallel to each other, and a step of changing the relative height of said table and said wafer retaining means so that each said wafer retaining means engages each wafer group stored in each said wafer storing means through the opening of said table and the bottom side of said wafer storing means and lifts up the wafer groups to a predetermined height out of said wafer storing means through its opening side, and wherein said wafer accommodating groove adjacent an end of each said wafer retaining means which opposed to another one of said wafer retaining means is formed at a position at which its center is spaced from said end by a distance no greater than half said second interval.

18. An apparatus for holding and transferring wafers from a plurality of transmittable wafer storing means to a wafer surface treatment processor, each of said wafer storing means storing an individual wafer group including a predetermined plurality of wafers that are substantially parallel with each other and spaced apart at predetermined first intervals along a first axis, all the wafers being stored in at least one of said plurality of wafer storing means, a wafer conveyor means for conveying the wafers to said wafer surface treatment processor; said apparatus comprising means for aligning the wafer groups stored in said wafer storing means on a predetermined straight line while maintaining relative positional relation among wafers inside each of said wafer groups so that said axes of each of said wafer groups coincide with each other, there being a second interval along said first axis between each of said wafer groups, said second interval being larger than said first interval, and shifting means for shifting at least one of said wafer groups along said first axis so that an interval in said first direction between said aligned wafer groups equals a predetermined second interval shorter than said interval;

said wafer conveyor means comprising:

supporting means for supporting said plurality of wafer storing means so that said axes of each of said wafer storing means are parallel to each other and a distance in said first direction between each of the wafer groups is said second interval, and wafer group extracting means for taking the wafer groups inside said wafer storing means supported by said supporting means out of each of said plurality of wafer storing means while maintaining relative positional relationship among wafers inside each wafer group so that axes of each of the wafer groups coincide with each other;

said plurality of wafer storing means being supported by said supporting means so that said axes of each of said wafer storing means coincide with each other and a distance on said axis between each of said wafer groups is said second interval;

each of said wafer storing means comprising a substantially rectangular bottom side having an opening facing bottom edges of all the wafers of said wafer group stored in said wafer storing means and having two long sides parallel to said first direction, two holding sides for holding said wafers provided parallel with each other along said long sides of said bottom side, and an opening side provided opposite said bottom side through which said wafer group can pass;

each of said holding sides having the same number of wafer holding grooves as the number of wafers included in said wafer group for respectively supporting side edges of said wafers formed at said first intervals on the surfaces of said holding sides that face each other;

said supporting means including a table having an opening on which said plurality of wafer storing means are supported, said opening of said table having a lengthwise dimension that exceeds the end to end distance of the wafers of said plurality of wafer storing means provided in end to end alignment on said table, and said supporting means includes means for positioning said plurality of wafer storing means on said table so that said opening of said bottom side of each said wafer storing means faces the opening of said table and axes of said plurality of wafer storing means coincide with each other;

said wafer group extracting means comprising:

a plurality of wafer retaining means shiftable parallel to said first axis and normally being below the opening of said table, and on their upper surfaces having wafer accommodating grooves for accommodating bottom edges of said wafers, said accommodating grooves being formed at said first intervals and being provided for holding the wafers stored in said wafer storing means so that respective wafers maintain said first intervals and are parallel with each other, and lifting means for changing the relative height of said table and said wafer retaining means between a first position where said table and said wafer retaining means do not interfere with each other and a second position where each of said wafer retaining means passes through the opening of said table and the opening of the bottom side of said wafer storing means, and holds and lifts the wafer group stored in each of said wafer storing means up to a predetermined height outside said wafer storing means from said opening side, and said wafer accommodating groove adjacent an end of each of said wafer retaining means which faces another one of said wafer retaining means is formed at a position where its end is spaced from said end by a distance no more than half of said second interval.

19. The apparatus according to claim 18, wherein said lifting means includes table lifting means for lifting and lowering said table between said second position where the upper surface of said wafer retaining means is positioned above said opening side of said wafer storing means and said first position where the upper surface of said wafer retaining means is below the lower surface of said table and does not interfere therewith.

20. The apparatus according to claim 18, also including wafer retaining means, said lifting means being operatively connected for lifting and lowering said wafer retaining means between said second position where the upper surface of said wafer retaining means is positioned above said opening side of said wafer storing means and said first position where the upper surface of said wafer retaining means is below the lower surface of said table and does not interfere therewith.

21. A method of holding and conveying wafers from a plurality of transmittable wafer storing means to a processor where wafers are subjected to a surface treatment process by utilizing a wafer conveyor means, said wafer storing means storing wafer groups each including a predetermined plurality of wafers that are substantially parallel to each other in face-to-face relationship and spaced from each other by predetermined first intervals along a first axis that is generally at right angles to faces of said wafers, all the wafers being stored in at least one of said plurality of wafer storing means, said method comprising the steps of:

aligning the wafer groups stored in said wafer storing means on a predetermined straight line while maintaining relative positional relationship between wafers in each of said wafer groups so that said axes of respective said wafer storing means coincide with each other and a second interval larger than said first interval exists along said first direction between respective said wafer groups;

shifting at least one of said wafer groups along said first axis until the interval between said aligned wafer groups along said first axis becomes equal to said first interval; and holding said shifted at least one of said wafer groups by utilizing said wafer conveyor means;

said step aligning said wafer groups comprising the steps of:

holding said plurality of wafer storing means by supporting means so that axes of respective said wafer groups are parallel to each other and a distance measured parallel to said first axis between respective wafer groups is said second interval, and extracting the wafer groups from inside said wafer storing means while the latter are supported by said supporting means and maintaining relative positional relation among wafers in each wafer group after extracting same from each of said plurality of wafer storing means so that axes of respective wafer groups coincide with each other;

said step of supporting said plurality of wafer storing means by the supporting means comprises a step of supporting said wafer storing means by said supporting means so that axes of respective said wafer groups coincide with each other and a distance on said axes between respective wafer groups is said second interval;

each said wafer storing means comprising:

a substantially rectangular bottom side having two long sides parallel to said first axis and having an opening exposing bottom edges of all the wafers of said wafer group stored in said wafer storing means, two holding sides provided parallel to each other and substantially perpendicular to said bottom side along said long sides of said bottom side for holding said wafers, and an opening side disposed opposite said bottom side and through which said wafer group can pass;

said supporting sides comprising the same number of wafer holding grooves as the number of wafers included in said wafer group formed at said first intervals on surfaces which oppose each other for supporting side edges of said wafers;

said supporting means comprising a table on which said plurality of wafer storing means are carried, and said table having an opening of a size that allows viewing, through the openings of said bottom sides, all the wafers within said plurality of wafer storing means carried on said table; and said step of supporting by said supporting means comprising a step of positioning said plurality of wafer storing means on said table so that said opening of said bottom side of each of said wafer storing means faces the opening of said table and axes of said plurality of wafer storing means coincide with each other;

said step of extracting from said plurality of wafer storing means the wafer groups inside said wafer storing means supported by said supporting means comprising;

a step of positioning below the opening of said table a plurality of wafer retaining means capable of shifting parallel to said first axis, said wafer retaining means having wafer accommodating grooves formed at said first intervals on their upper surfaces for accommodating bottom edges of said wafers and for holding the wafers stored in respective said wafer storing means by said wafer holding grooves so that the respective wafers are maintained spaced by said first intervals and parallel to each other, and a step of changing the relative height of said table and said wafer retaining means so that each said wafer retaining means engages each wafer group stored in each said wafer storing means through the opening of said table and the bottom side of said wafer storing means and lifts up the wafer groups to a predetermined height out of said wafer storing means through its opening side, and wherein said wafer accommodating groove adjacent an end of each said wafer retaining means which opposes another one of said wafer retaining means is formed at a position at which its center is spaced from said end by a distance no greater than half said first interval.

22. The method according to claim 21, wherein the step of changing the relative height of said table and said wafer retaining means comprises a step of lowering said table using table lifting means until an upper surface of said wafer retaining means is located above said opening side of said wafer storing means.

23. A method of holding and conveying wafers from a plurality of transmittable wafer storing means to a processor where wafers are subjected to a surface treatment process by utilizing a wafer conveyor means, said wafer storing means storing wafer groups each including a predetermined plurality of wafers that are substantially parallel to each other in face-to-face relationship and spaced from each other by predetermined first intervals along a first axis that is generally at right angles to faces of said wafers, all the wafers being stored in at least one of said plurality of wafer storing means, said method comprising the steps of:

aligning the wafer groups stored in said wafer storing means on a predetermined straight line while maintaining relative positional relationship between wafers in each of said wafer groups so that said axes of respective said wafer storing means coincide with each other and a second interval larger than said first interval exists along said first direction between respective said wafer groups;

shifting at least one of said wafer groups along said first axis until the interval between said aligned wafer groups along said first axis becomes equal to said first interval; and holding said shifted at least one of said wafer groups by utilizing said wafer conveyor means;

said step of aligning said wafer groups comprising the steps of:

holding said plurality of wafer storing means by supporting means so that axes of respective said wafer groups are parallel to each other and a distance measured parallel to said first axis between respective wafer groups is said second interval, and extracting the wafer groups from inside said wafer storing means while the latter are supported by said supporting means and maintaining relative positional relation among wafers in each wafer group after extracting same from each of said plurality of wafer storing means so that axes of respective wafer groups coincide with each other;

said step of supporting said plurality of wafer storing means by the supporting means comprises a step of supporting said wafer storing means by said supporting means so that axes of respective said wafer groups coincide with each other and a distance on said axes between respective wafer groups is said second interval;

each said wafer storing means comprising;

a substantially rectangular bottom side having two long sides parallel to said first axis and having an opening exposing bottom edges of all the wafers of said wafer group stored in said wafer storing means, two holding sides provided parallel to each other and substantially perpendicular to said bottom side along said long sides of said bottom side for holding said wafers, and an opening side disposed opposite said bottom side and through which said wafer group can pass;

said supporting sides comprising the same number of wafer holding grooves as the number of wafers included in said wafer group formed at said first intervals on surfaces opposing each other for supporting side edges of said wafers;

said supporting means comprising a table on which said plurality of wafer storing means are carried, and said table having an opening of a size that allows viewing, through the openings of said bottom sides, all the wafers within said plurality of wafer storing means carried on said table; and said step of supporting by said supporting means comprising a step of positioning said plurality of wafer storing means on said table so that said opening of said bottom side of each of said wafer storing means faces the opening of said table and axes of said plurality of wafer storing means coincide with each other;

said step of extracting from said plurality of wafer storing means the wafer groups inside said wafer storing means retained by said retaining means comprising the steps of:

preparing under the opening of said table a plurality of first wafer retaining means having wafer accommodating grooves for accommodating bottom peripheries of said wafers respectively formed at said first intervals on their upper surfaces for retaining the wafers stored in said wafer accommodating grooves respective said wafer storing means so that respective wafers maintain said first intervals in parallel to each other, and changing the relative height of said table and said wafer retaining means so that said first wafer retaining means retain and lift the wafer groups stored in said wafer storing means passing through the opening of said table and the bottom side of said wafer storing means from said opening side; and wherein said wafer accommodating groove adjacent an end of each said first wafer retaining means which opposes another said first wafer retaining means is formed at a position where its center is spaced apart from said end by a distance no greater than half of said first interval.

24. The method according to claim 23, wherein said step of changing the relative height of said table and said wafer retaining means comprises a step of lowering said table using the table lifting means until the upper surface of said first wafer retaining means is located above said opening side of said first wafer storing means.

25. The method according to claim 24, wherein said wafer conveyor means is of a length capable of retaining all the wafers in said wafer groups with the latter being spaced apart from each other by said second interval, and wherein said step of moving at least one of said wafer groups along said first axis comprises, a step of preparing and arranging in parallel with said first wafer retaining means a plurality of second wafer retaining means capable of shifting parallel to said first axis, each of said second wafer retaining means having wafer accommodating grooves for accommodating bottom edges of said wafers formed at said first intervals on their upper surfaces for retaining the wafers stored in said wafer storing means so that the wafers are maintained spaced apart equal to said first intervals and are parallel with each other in said wafer accommodating grooves, said wafer accommodating groove adjacent the end facing another said second wafer retaining means of each of said second wafer retaining means being disposed with its center spaced away from said end by no more than half of said first interval, a first transferring step of transferring said wafers retained by said first wafer retaining means to said wafer conveyor means, a step of conveying with said wafer conveyor means said wafers from above said first wafer retaining means to above said second wafer retaining means, a second transferring step of transferring the wafers held by said wafer conveyor means to said second wafer retaining means, and a step of shifting at least one of said first wafer retaining means parallel to said first axis so that the wafer accommodating grooves formed adjacent mutually facing ends of respective said second wafer retaining means are spaced apart by said first interval.

26. The method according to claim 25, wherein said wafer conveyor means comprises a pair of wafer holding means having number of wafer accommodating grooves for accommodating edges of the wafers equal to at least the number of all the wafers stored in said plurality of wafer storing means respectively formed at said first intervals, first driving means for holding said pair of wafer holding means in parallel with said first direction so that respective said wafer accommodating grooves faces each other to define a plane perpendicular to said first direction and driving said pair of wafer holding means so that a distance between said pair of wafer holding means changes between a first distance at which bottoms of said wafer accommodating grooves hold edges of said wafers and a second distance where the bottoms of said wafer accommodating grooves release the edges of said wafers, and second driving means for driving said first driving means in longitudinal and transverse directions, and said first transferring step comprises the steps of:

positioning said pair of wafer holding means at a position where said pair of wafer holding means does not interfere with said wafer storing means of said table so that distances from said axis of said storing means provided on said table to each of said pair of wafer holding means are equal to each other, positioning said pair of wafer holding means by said first driving means so that a distance therebetween is said second distance, lowering said pair of wafer holding means by said second driving means to a position where said pair of wafer holding means can hold said wafers held by said first wafer retaining means, positioning the lowered said pair of wafer holding means by said first driving means so that a distance therebetween is said first distance thereby holding said wafers by said pair of wafer holding means, and raising said pair of wafer holding means holding said wafers therebetween by said second driving means to a position where said pair of wafer holding means do not interfere with said wafer storing means that are provided on said table.

27. The method according to claim 26, wherein said second transferring step comprises the steps of:

positioning said pair of wafer holding means holding said wafers to a position where said pair of wafer holding means do not interfere with said second wafer holding means spaced immediately above said second wafer retaining means, lowering said pair of wafer holding means by said second driving means to a position where said first wafer retaining means can retain lower edges of said wafers held by said pair of wafer holding means, positioning the lowered said pair of wafer holding means by said first driving means so that a distance therebetween is said second distance thereby releasing said wafers from said pair of wafer holding means, and raising said pair of wafer holding means holding said wafers by said second driving means to a position where said pair of wafer holding means do not interfere with said second wafer retaining means.

28. The method according to claim 27, wherein the step of holding said shifted said wafer groups by wafer conveyor means comprises the steps of:

positioning said pair of wafer holding means to a position where said pair of wafer holding means do not interfere with said second wafer retaining means spaced immediately above said second wafer retaining means, positioning said pair of wafer holding means by said first driving means so that a distance therebetween is said second distance, lowering said pair of wafer holding means by said second driving means to a position where said pair of wafer holding means can hold said wafers retained by said second wafer retaining means, positioning the lowered said pair of wafer holding means by said first driving means so that a distance therebetween is said first distance thereby holding said wafers by said pair of wafer holding means, and raising said pair of wafer holding means holding said wafers by said second driving means to a position where said pair of wafer holding means do not interfere with said second wafer retaining means.

29. A method of holding and conveying wafers from a plurality of transmittable wafer storing means to a processor where wafers are subjected to a surface treatment process by utilizing a wafer conveyor means, said wafer storing means storing wafer groups each including a predetermined plurality of wafers that are substantially parallel to each other in face-to-face relationship and spaced from each other by predetermined first intervals along a first axis that is generally at right angles to faces of said wafers, all the wafers being stored in at least one of said plurality of wafer storing means, said method comprising the steps of:

aligning the wafer groups stored in said wafer storing means on a predetermined straight line while maintaining relative positional relationship between wafers in each of said wafer groups so that said axes of respective said wafer storing means coincide with each other and a second interval larger than said first interval exists along said first direction between respective said wafer groups;

shifting at least one of said wafer groups along said first axis until the interval between said aligned wafer groups along said first axis becomes equal to said first interval; and holding said shifted at least one of said wafer groups by utilizing said wafer conveyor means;

each of said wafers having an orientation flat for determining a crystallographic reference direction, and positioning the crystallographic reference directions of said wafers to coincide with each other prior to the step of aligning said wafer groups;

each of said wafer storing means comprising a substantially rectangular bottom side having an opening opposite bottom edges of all wafers of said wafer groups stored in said wafer storing means and having two long sides parallel to said first axis, two holding sides for holding said wafers provided in parallel to each other substantially perpendicular to said bottom plate along said long sides of said bottom side, and an opening side which said wafer groups can pass through and which is disposed opposite said bottom side, and wherein each said holding side has the same number of wafer holding grooves as the number of wafers included in said wafer group for supporting side edges of respective said wafers spaced apart by said first intervals, said supporting means comprises a table having an opening on which said plurality of wafer storing means are provided, said opening having a lengthwise dimension greater than the distance between end wafers in a row consisting of all the wafers of said plurality of wafer storing means provided on said table, and said step of making crystallographic reference directions of said wafers coincide with each other, comprises the additional steps of:

positioning said plurality of wafer storing means on said table so that said opening of said bottom side of each said wafer storing means faces the opening of said table and said axes of said plurality of wafer storing means coincide with each other, utilizing wafer rotating means normally disposed below the opening of said table for rotating said wafers around a predetermined rotation axis in contact with lower edges of all the wafers provided on said table;

changing the relative height of said table and said wafer rotating means and said table to a position where said wafer rotating means passes through the opening of said table and said opening of the bottom side of said wafer storing means to contact peripheries of the wafers stored in said wafer storing means but not in contact with said orientation flats of said peripheries, and rotating said wafer rotating means until said wafers are not in contact with said wafer rotating means after said wafers contact said wafer rotating means.

30. The method according to claim 29, wherein the step of aligning said wafer groups, comprises the steps of:

changing the relative height of said table and said wafer rotating means until said table no longer interferes with said wafer rotating means, and removing the wafer groups from the respective said wafer storing means disposed on said table while maintaining the same positional relation among wafers of each wafer group disposed within the respective wafer storing means so that the axes of respective wafer groups coincide.

31. The method according to claim 30, wherein the step of taking the wafer groups of respective said wafer storing means supported by said supporting means out of respective said plurality of wafer storing means comprises the steps of:

preparing, below the opening of said table in place of said wafer rotating means, a plurality of wafer retaining means shiftable along said first axis for retaining the wafers respectively stored in said wafer storing means in said wafer accommodating grooves to maintain said wafers in parallel face-to-face relationship and spaced apart by said first intervals, each of said retaining means having on their upper surfaces a plurality of wafer accommodating grooves for accommodating bottom edges of said wafers formed in a direction parallel to said first axis at said first intervals, changing the relative height of said table and said wafer retaining means so that each said wafer retaining means passes through the opening of said table and the bottom side of said wafer storing means to hold and lift the wafer groups stored in each said wafer storing means from said opening side, and wherein said wafer accommodating groove adjacent an end facing another said wafer retaining means of each said wafer retaining means being formed at a position where its center is spaced from said end by no more than half of said first interval.

32. The method according to claim 31, wherein the step of preparing the wafer retaining means under the opening of said table instead of said wafer rotating means comprises the steps of:

arranging said wafer retaining means with their said wafer accommodating grooves in a row parallel to a direction of a rotation axis of said wafer rotating means, and moving said table from above said wafer rotating means to above said wafer retaining means until said opening of said table is positioned in alignment with said wafer retaining means, and wherein changing the relative height of said table and said wafer retaining means comprises a step of lowering said table until the upper surface of said wafer retaining means is located above said opening side of said wafer storing means.

33. The method according to claim 32, wherein said step of moving at least one of said wafer groups along said first direction comprises a step of shifting at least one of said wafer retaining means along said first direction so that wafer accommodating grooves formed adjacent mutually facing ends of each of said wafer retaining means are spaced from each other by said first interval.

34. The method according to claim 33, wherein said wafer conveyor means comprises:

a pair of wafer holding means having at least enough wafer accommodating grooves for accommodating edges of all the wafers stored in said plurality of wafer storing means and spaced by said first intervals, first driving means for holding said pair of wafer holding means parallel to said first direction so that respective said wafer accommodating grooves faces each other to define planes perpendicular to said first axis, and for driving said pair of wafer holding means so that a distance between said pair of wafer holding means changes from a first distance where bottoms of said wafer accommodating grooves hold edges of said wafers and a second distance where the bottoms of said wafer accommodating grooves release the edges of said wafers, and second driving means for driving said first driving means in longitudinal and transverse directions, and said step of holding said shifted wafer groups by said wafer conveyor means comprises the steps of:

positioning said pair of wafer holding means at a location where said pair of wafer holding means do not interfere with said wafer storing means of said table so that distances from said axis of said storing means provided on said table to each of said pair of wafer holding means are equal, positioning said pair of wafer holding means by utilizing said first driving means so that a distance therebetween is said second distance, lowering said pair of wafer holding means by said second driving means to a position where said wafers as aligned and retained and shifted by said wafer retaining means can be held, positioning the lowered said pair of wafer holding means by utilizing said first driving means so that a distance therebetween is said first distance thereby holding said wafers by said pair of wafer holding means, and utilizing said second driving means to position said pair of wafer holding means that are holding said wafers therebetween at a location where said pair of wafer holding means do not interfere with said wafer storing provided on said table and then transferring the same for subsequent processing.

35. An apparatus for holding and transferring wafers from a plurality of transmittable wafer storing means to a wafer surface treatment processor, each of said wafer storing means storing an individual wafer group including a predetermined plurality of wafers that are substantially parallel with each other and spaced apart at predetermined first intervals along a first axis, all the wafers being stored in at least one of said plurality of wafer storing means, a wafer conveyor means for conveying the wafers to said wafer surface treatment processor; said apparatus comprising means for aligning the wafer groups stored in said wafer storing means on a predetermined straight line while maintaining relative positional relation among wafers inside each of said wafer groups so that said axes of each of said wafer groups coincide with each other, there being a second interval along said first axis between each of said wafer groups, said second interval being larger than said first interval, and shifting means for shifting at least one of said wafer groups along said first axis so that an interval in said first direction between said aligned wafer groups equal said first interval;

said wafer means comprising:

supporting means for supporting said plurality of wafer storing means so that said axes of each of said wafer storing means are parallel to each other and a distance in said first direction between each of the wafer groups is said second interval, and wafer group extracting means for taking the wafer groups inside said wafer storing means supported by said supporting means out of each of said plurality of wafer storing means while maintaining relative positional relationship among wafers inside each wafer group so that axes of each of the wafer groups coincide with each other;

said plurality of wafer storing means being supported by said supporting means so that axes of each of said wafer storing means coincide with each other and a distance on said axis between each of said wafer groups is said second interval;

each of said wafer storing means comprising a substantially rectangular bottom side having an opening facing bottom edges of all the wafers of said wafer group stored in said wafer storing means and having two long sides parallel to said first direction, two holding sides for holding said wafer provided parallel with each other along said long sides of said bottom side, and an opening side provide opposite said bottom side through which said wafer group can pass;

each of said holding sides having the same number of wafer holding grooves as the number of wafers included in said wafer group for respectively supporting side edges of said wafers formed at said first intervals on the surfaces of said holding sides that face each other said supporting means including a table having an opening on which said plurality of wafer storing means are supported, said opening of said table having a lengthwise dimension that exceeds the end to end distance of the wafers of said plurality of wafer storing means provided in end to end alignment on said table, and said supporting means includes means for positioning said plurality of wafer storing means on said table so that said opening of said bottom side of each said wafer storing means faces the opening of said table and the axes of said plurality of wafer storing means coincide with each other;

said wafer group extracting means comprising:

a plurality of wafer retaining means shiftable parallel to said first axis and normally being below the opening of said table, and on their upper surfaces having wafer accommodating grooves for accommodating bottom edges of said wafers, said accommodating grooves being formed at said first intervals and being provided for holding the wafers stored in said wafer storing means so that respective wafers maintain said first intervals and are parallel with each other, and lifting means for changing the relative height of said table and said wafer retaining means between a first position where said table and said wafer retaining means do not interfere with each other and a second position where each of said wafer retaining means passes through the opening of said table and the opening of the bottom side of said wafer storing means, and holds and lifts the wafer group stored in each of said wafer storing means up to a predetermined height outside said wafer storing means from said opening side, and said wafer accommodating groove adjacent an end of each said wafer retaining means which faces another one of said wafer retaining means is formed at a position where its end is spaced apart by no more than half of said first interval from said end.

36. The apparatus according to claim 35, wherein said lifting means includes table lifting means for lifting and lowering said table between said second position where the upper surface of said wafer retaining means is positioned above said opening side of said wafer storing means and said first position where the upper surface of said wafer retaining means is below the lower surface of said table and does not interfere therewith.

37. The apparatus according to claim 36, wherein said shifting means comprises
a slider means provided below said table for slidably moving one of said wafer retaining means parallel to said first axis to a position not interfering with said table below said wafer retaining means, and
driving means for driving and sliding said slider means parallel to said first axis.

38. The apparatus according to claim 35, also including wafer retaining means, said lifting means being operatively connected for lifting and lowering said wafer retaining means between said second position where the upper surface of said wafer retaining means is positioned above said opening side of said wafer storing means and said first position where the upper surface of said wafer retaining means is below the lower surface of said table and does not interfere therewith.

39. The apparatus according to claim 38, wherein said slider means comprises a pair of slider sections.

40. The apparatus according to claim 39, wherein said driving means includes an air cylinder having its main body fixed to one of said pair of slider sections and its cylinder rod fixed to the other of said slider sections.

41. The apparatus according to claim 39, wherein said driving means comprises
a nut fixed to one of said pair of slider sections and having an opening in said first direction which is threaded,
a rod having a screw which engages with said opening of said nut around its periphery and extends in parallel with said first axis,
bearing means for rotatably supporting one end of said rod which is closer to the other one of said pair of slider sections,
a fixing member for fixing said bearing means to the other one of said pair of slider sections, and
rotation driving means fixedly connected to said fixing means for driving said rod around its axis.

42. The apparatus according to claim 41, wherein said rotation driving means comprises,
a motor fixed to said fixing member, and
transmitting means for transmitting rotation of a rotation axis of said motor to a portion of said rod which is closer to the other one of said pair of slider sections than a portion engaging with said nut.

43. The apparatus according to claim 42, wherein said transmitting means comprises a first pulley fixed to said rod at a portion closer to the other one of said pair of slider sections than a portion engaging with said nut, a second pulley fixed to the rotation axis of said motor, and a transmission belt installed over said first pulley and said second pulley.

44. The apparatus according to claim 39, wherein said wafer conveyor means comprises:

a pair of wafer holding means having number of wafer accommodating grooves for accommodating edges of the wafers equal to at least the number of all the wafers stored in said plurality of wafer storing means formed at first intervals, first driving means for holding said pair of wafer holding means in parallel with said first direction so that each of said wafer accommodating grooves faces each other to define a plane perpendicular to said first direction and driving said pair of wafer holding means so that a distance between said pair of wafer holding means changes between a first distance where bottoms of said wafer accommodating grooves hold edges of said wafers and a second distance where the bottoms of said wafer accommodating grooves release the edges of said wafers, and second driving means for driving said first driving means in longitudinal and transverse directions.

45. An apparatus for holding and transferring wafers from a plurality of transmittable wafer storing means to a wafer surface treatment processor, each of said wafer storing means storing an individual wafer group including a predetermined plurality of wafers that are substantially parallel with each other and spaced apart at predetermined first intervals along a first axis, all the wafers being stored in at least one of said plurality of wafer storing means, a wafer conveyor means for conveying the wafers to said wafer surface treatment processor; said apparatus comprising means for aligning the wafer groups stored in said wafer storing means on a predetermined straight line while maintaining relative positional relation among wafers inside each of said wafer groups so that said axes of each of said wafer groups coincide with each other, there being a second interval along said first axis between each of said wafer groups, said second interval being larger than said first interval, and shifting means for shifting at least one of said wafer groups along said first axis so that an interval in said first direction between said aligned wafer groups equal said first interval;

each of said wafers having an orientation flat for determining a crystallographic reference direction, and said apparatus further comprising reference direction aligning means for making crystallographic reference directions of said wafers coincide with each other prior to aligning said wafer groups;

each of said wafer storing means including;

a substantially rectangular bottom side having an opening toward which bottom edges of all wafers of said wafer groups stored in said wafer storing means face, said opening having two long sides parallel to said first direction, two supporting sides provided along said long sides of said bottom side generally parallel with each other and substantially perpendicular to said bottom side for holding said wafers, and an opening side provided opposite said bottom side and through which said wafer group can pass;

each of said holding sides having the same number of wafer holding grooves as the number of wafers included in said wafer group for respectively supporting side edges of wafers formed at said first intervals on each of the holding side surfaces facing each other;

said supporting means includes a table having an opening on which said plurality of wafer storing means are disposed;

said opening of said table being formed having dimension so that said opening of said table can face, through the opening of said bottom side of each of said wafer storing means, all the wafers stored in said plurality of wafer storing means provided on said table;

said reference direction aligning means comprising means for positioning said plurality of wafer storing means on said table so that said opening of said bottom side of each of said wafer storing means faces the opening of said table and also said axes of said plurality of wafer storing means coincide, wafer rotating means capable of being arranged under the opening of said table for rotating said wafers by rotating around a predetermined rotation axis in contact with lower edges of all the wafers provided on said table, lifting means for changing the relative height of said wafer rotating means and said table between a position where said wafer rotating means passes through the opening of said table and said opening of the bottom side of said wafer storing means to contact the peripheral edges of the wafers stored in said wafer storing means but not the said orientation flats thereof, and a position where said wafer rotating means does not interfere with said table, and rotation driving means operable, after each said wafer contacts said wafer rotating means, for rotating said wafer rotating means until each said wafer no longer contacts said wafer rotating means.

46. The apparatus according to claim 45, wherein said wafer group aligning means includes wafer extracting means for removing the wafer groups from inside said wafer storing means supported on said table while maintaining relative positional relation among the wafers in each wafer group so that axes of respective wafer groups coincide with each other.

47. The apparatus according to claim 46, wherein said wafer extracting means comprises, a plurality of wafer retaining means capable of being arranged under the opening of said table and shiftable in said first direction and having on their surfaces a plurality of wafer accommodating grooves for accommodating bottom edges of said wafers that are arranged in a direction parallel to said first axis and spaced by said first intervals, said wafer accommodating grooves retaining the wafers stored in said wafer storing means while maintaining said first intervals between respective wafers and maintaining said wafers in parallel, and means for alternately arranging said wafer rotating means and said wafer retaining means under said opening of said table, and said lifting means changes the relative height of said table and said wafer retaining means so that said plurality of wafer retaining means retain and lift the wafer groups stored in said wafer storing means passing through the opening of said table and the bottom side of said wafer storing means to a predetermined height outside said wafer storing means from said opening side, and said wafer accommodating groove adjacent an end of each of said wafer retaining means which faces another one of said wafer retaining means is formed at a position where its center is spaced from said end by no more than half said first interval.

48. The apparatus according to claim 47, wherein the means of alternately arranging said wafer rotating means and said wafer retaining means under said opening of said table comprises, means for holding said wafer retaining means so that a direction of arrangement of said wafer accommodating grooves is in a line parallel to a direction of the rotation axis of said wafer rotating means, and table moving means for moving said table from above said wafer rotating means to above said wafer retaining means until said opening of said table is positioned above said wafer retaining means, and said lifting means includes table lifting means for lifting and lowering said table between a position where the upper surface of said wafer retaining means is above said opening side of said wafer storing means and a position where said table is above and does not interfere with the upper surface of said wafer retaining means.

49. The apparatus according to claim 48, wherein the means for moving at least one of said wafer groups parallel to said first axis includes means for shifting at least one of said wafer retaining means parallel to said first axis so that wafer accommodating grooves formed adjacent ends of said wafer retaining means facing each other are separated by said first interval from each other.

50. The apparatus according to claim 49, wherein said wafer conveyor means comprises a pair of wafer holding means having at least as many wafer accommodating grooves as are required for accommodating edges of all the wafers stored in said plurality of wafer storing means and spaced by said first intervals, first driving means for holding said pair of wafer holding means parallel to said first axis so that said wafer accommodating grooves face each other to define planes perpendicular to said first direction and driving said pair of wafer holding means so that a distance between said pair of wafer holding means changes between a first distance at which bottoms of said wafer accommodating grooves hold edges of said wafers and a second distance where the bottoms of said wafer accommodating grooves release the edges of said wafers, and second driving means for driving said first driving means in longitudinal and transverse directions.

51. The apparatus according to claim 50, wherein the means for shifting at least one of said wafer retaining means comprises, a pair of slider means for respectively holding and slidably moving said wafer retaining means parallel to said first axis while said table is positioned under said wafer retaining means and said pair of slider means is positioned below said table, and driving means for driving and sliding each said slider means parallel to said first axis.

52. The apparatus according to claim 51, wherein said driving means includes an air cylinder having its main body fixed to one of said pair of slider means and its cylinder rod fixed to the other of said pair of slider means, respectively.

53. The apparatus according to claim 52, wherein said driving means comprises a nut fixed to one of said pair of slider means and having a threaded opening that extends parallel to said first axis, a rod having a screw which engages with said opening of said nut around its periphery and arranged parallel to said first direction, bearing means for rotatably supporting one end of said rod which is closer to the other one of said pair of slider means than to said one of said pair of slider means, a fixing member for fixing said bearing means to the other one of said pair of slider means, and rotation driving means affixed to said fixing means for rotating said rod around its axis.

54. The apparatus according to claim 53, wherein said rotation driving means comprises a motor affixed to said fixing member, and transmitting means for transmitting rotation of an output shaft of said motor to a portion of said rod which is closer to the other one of said pair of slider means than to a portion of said rod which engages with said nut.

55. The apparatus according to claim 54, wherein said transmitting means comprises, a first pulley affixed to a portion of said rod closer to the other one of said pair of slider means than the portion of said rod engaging with said nut, a second pulley connected to the output shaft of said motor, and a transmitting belt drivingly engaged with said first pulley and said second pulley.

* * * * *